US008573784B2

(12) United States Patent
Yeh et al.

(10) Patent No.: US 8,573,784 B2
(45) Date of Patent: Nov. 5, 2013

(54) IMAGING APPARATUS HAVING AN OPTICAL SENSOR

(75) Inventors: Wen-Yung Yeh, Hsinchu County (TW);
Chia-Hsin Chao, Taichung (TW);
Yu-Hung Chuang, New Taipei (TW);
Chia-Ling Li, New Taipei (TW);
Chun-Feng Lai, Taichung (TW);
Hsi-Hsuan Yen, Taipei (TW);
Sheng-Chieh Tai, Taichung (TW);
Kuang-Yu Tai, Hsinchu (TW);
Tse-Peng Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 26 days.

(21) Appl. No.: 13/212,212

(22) Filed: Aug. 18, 2011

(65) Prior Publication Data

US 2011/0299044 A1    Dec. 8, 2011

Related U.S. Application Data

(63) Continuation of application No. PCT/CN2010/074245, filed on Jun. 22, 2010, which is a continuation of application No. 12/781,419, filed on May 17, 2010.

(60) Provisional application No. 61/219,331, filed on Jun. 22, 2009, provisional application No. 61/250,703, filed on Oct. 12, 2009, provisional application No. 61/291,389, filed on Dec. 31, 2009.

(51) Int. Cl.
*G03B 21/16*    (2006.01)

(52) U.S. Cl.
USPC ................................ 353/85; 353/94; 353/52

(58) Field of Classification Search
USPC .................................. 353/30, 52, 85; 359/298
See application file for complete search history.

(56) References Cited

U.S. PATENT DOCUMENTS

| | | | |
|---|---|---|---|
| 6,734,465 B1 | 5/2004 | Taskar et al. | |
| 7,400,439 B2 * | 7/2008 | Holman | 359/298 |
| 7,651,227 B2 * | 1/2010 | Penn et al. | 353/102 |
| 2007/0284564 A1 | 12/2007 | Biwa et al. | |

(Continued)

FOREIGN PATENT DOCUMENTS

| | | |
|---|---|---|
| CN | 1350264 | 5/2002 |
| CN | 1916691 | 2/2007 |

(Continued)

OTHER PUBLICATIONS

Liu et al, "Monolithic LED Microdisplay on Active Matrix Substrate Using Flip-Chip Technology", IEEE Journal of Selected Topics in Quantum Electronics, 2009, p. 1-p. 5.

(Continued)

*Primary Examiner* — Tony Ko
(74) *Attorney, Agent, or Firm* — Jianq Chyun IP Office

(57) ABSTRACT

A projection apparatus is provided. The projection apparatus includes a light-emitting unit array, an optical sensor, and a control unit. The light-emitting unit array is for emitting an image beam. The optical sensor is for detecting electromagnetic waves so as to generate a signal. The control unit is electrically coupled to the light-emitting unit array and the optical sensor for controlling emission of the light-emitting unit array according to the signal from the optical sensor.

34 Claims, 36 Drawing Sheets

(56) References Cited

U.S. PATENT DOCUMENTS

| | | |
|---|---|---|
| 2008/0084600 A1 | 4/2008 | Bita et al. |
| 2008/0277681 A1 | 11/2008 | Xu et al. |
| 2009/0114931 A1 | 5/2009 | Hsueh et al. |
| 2010/0117997 A1* | 5/2010 | Haase .......................... 345/204 |

FOREIGN PATENT DOCUMENTS

| | | |
|---|---|---|
| CN | 101076900 | 11/2007 |
| CN | 101304058 | 11/2008 |
| TW | I279638 | 4/2007 |
| TW | I287167 | 9/2007 |
| TW | I296069 | 4/2008 |
| WO | 2006098545 | 5/2004 |
| WO | 2007055468 | 5/2007 |
| WO | 2008109296 | 9/2008 |

OTHER PUBLICATIONS

Park et al., "Printed Assemblies of Inorganic Light-Emitting Diodes for Deformable and Semitransparent Displays", Science 325, 977, 2009, p. 977-p. 981.

Riehemann, et al., "Ultra Small OLED Pico Projector", Optik & Photonik, No. 2, Jun. 2009, p. 34-p. 36.

"International Search Report (Form PCT/ISA/210) with Written Opinion (Form PCT/ISA/237)", mailed Jun. 22, 2010, p. 1-p. 12, in which the listed references were cited.

"First Office Action of China counterpart application" issued on May 31, 2013, p. 1-p. 6, in which the listed references were cited.

"Office Action of Taiwan counterpart application" issued on Jul. 1, 2013, p1-p6, in which the listed references were cited.

* cited by examiner

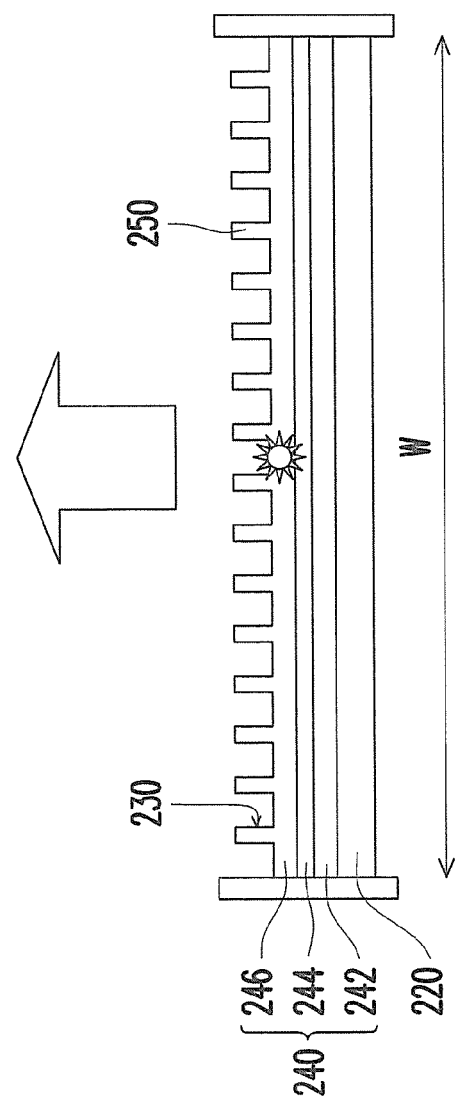

IMAGING APPARATUS HAVING AN OPTICAL SENSOR

CROSS-REFERENCE TO RELATED APPLICATION

This application is a continuation application of and claims the priority benefit of PCT application serial no. PCT/CN2010/074245, filed on Jun. 22, 2010, now pending. The prior PCT application serial no. PCT/CN2010/074245 is a continuation application of and claims the priority benefit of U.S. application Ser. No. 12/781,419, filed on May 17, 2010, which claims the priority benefit of U.S. provisional application Ser. No. 61/219,331, filed on Jun. 22, 2009. The prior PCT application serial no. PCT/CN2010/074245 also claims the priority benefits of U.S. provisional application Ser. No. 61/250,703, filed on Oct. 12, 2009 and U.S. provisional application Ser. No. 61/291,389, filed on Dec. 31, 2009. The entirety of each of the above-mentioned patent applications is hereby incorporated by reference herein and made a part of this specification.

BACKGROUND

1. Technical Field

The present disclosure relates to a display apparatus, and more particularly to a projection apparatus.

2. Background

In recent years, light emitting diodes (LEDs) have gradually improved the light emitting efficiency and replaced fluorescent lamps and incandescent lamps in some fields, including highly responsive speed lamps for scanners, backlight sources or front light sources for liquid crystal displays (LCDs), light sources for instrument panel of automobiles, traffic signal lamps, light sources for projection devices and even ordinary illumination devices. The light emission of LEDs is typically cold light emission, rather than by heat or discharge, therefore LEDs often have relatively long operating lifetime of up to 100,000 hours, and with no idling time required. LEDs also have such advantages as faster responsive speed (about $10^{-9}$ sec), smaller size, lower power consumption, lower contamination, higher reliability, capability for mass production. Accordingly, LEDs are wildly used in many fields.

Typical LEDs are usually semiconductor devices using III-V compounds, such as GaP, GaAs. Since the III-V compound semiconductor materials of the LED have a characteristic of converting electricity into light, when a current is applied to the semiconductor materials, electrons therein would be combined with holes and release excessive energy in a form of light, thereby achieving an effect of luminosity. Besides, the basic structure of an LED device includes a P-type and an N-type epitaxial layer fabricated using a compound of the III-V semiconductors and a light emission layer sandwiched between the two epitaxial layers.

The light emitting efficiency of the aforesaid light emitting diode depends mainly on the quantum efficiency of the light emitting layer and the light extraction efficiency of the entire light emitting diode. The quantum efficiency of the light emitting layer mainly depends on the epitaxy quality and structure of the light emitting layer and the light extraction efficiency mainly depends on the effective utilization of the light produced by the light emission layer (active layer).

Accordingly, how to provide a LED having high light extraction and collimation and how to simply the fabricating process of LED in order to reduce costs of production become important issues in the current LED technology.

SUMMARY

A projection apparatus adapted to project an image beam so as to form an image is introduced herein. The projection apparatus includes a light-emitting unit array, a circuit substrate, an optical sensor, a control unit, and a projection optics. The light-emitting unit array is for emitting the image beam. The light-emitting unit array includes a plurality of light-emitting units monolithically integrated. The circuit substrate is disposed under the light-emitting unit array, wherein the circuit substrate is electrically connected to the light-emitting unit array for individual driving the light-emitting units. The optical sensor is for detecting electromagnetic waves from at least one of the image and an environment so as to generate a signal. The control unit is electrically coupled to the light-emitting unit array and the optical sensor for controlling emission of the light-emitting unit array according to the signal from the optical sensor. The projection optics is for projecting the image beam, to form the image wherein the projection optics is electrically coupled to the control unit, and the control unit controls the projection optics according to the signal from the optical sensor.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1 is a schematic cross-sectional view of micro-LED array according to the first embodiment of the present disclosure.

DETAILED DESCRIPTION OF DISCLOSED EMBODIMENTS

Figure 2A:
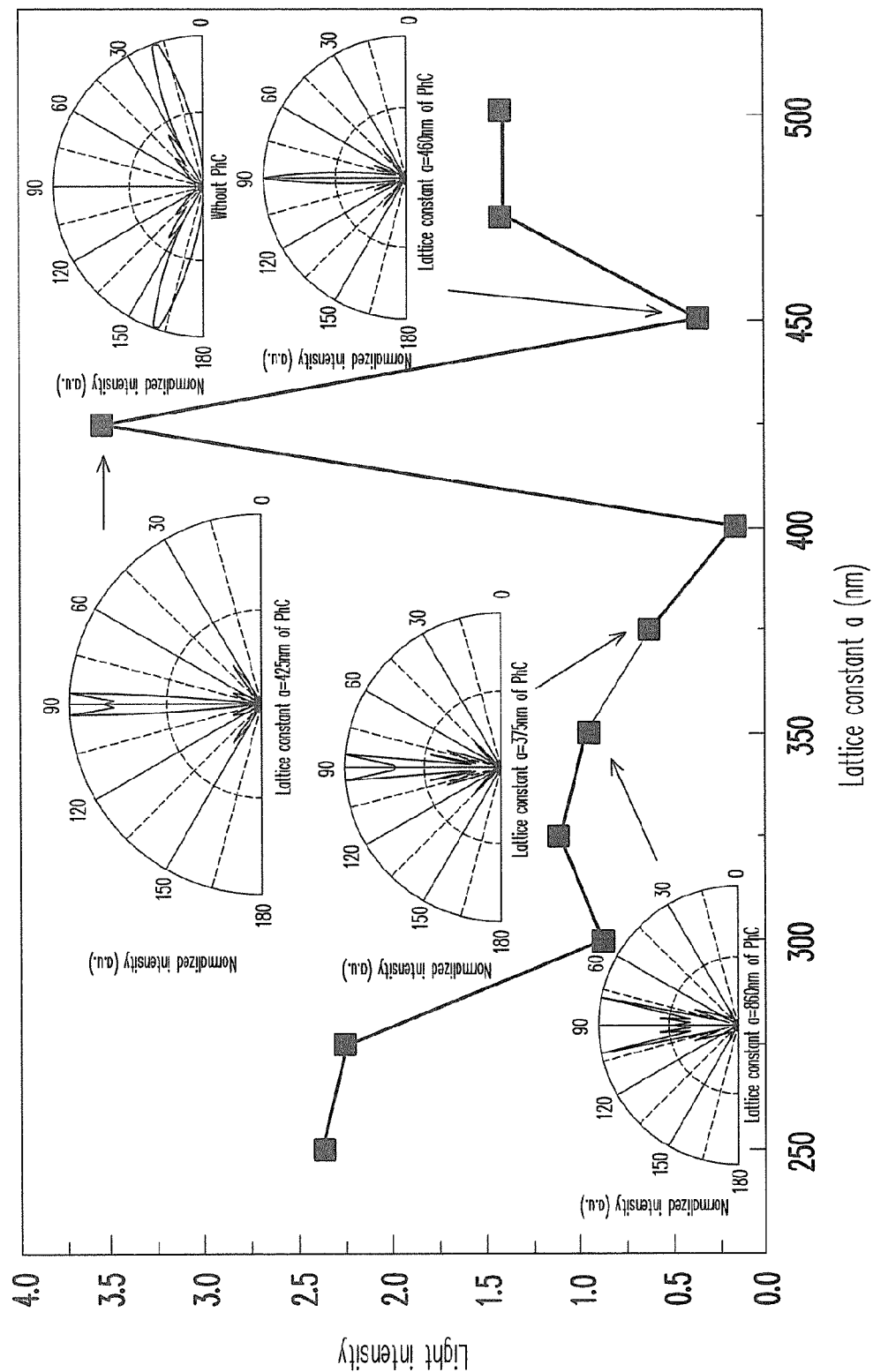
FIG. 2A is a light extraction efficiency and light intensity distribution curve diagram of lights emitted from micro-LEDs.

In the present disclosure, a micro-light-emitting diode (LED) array is accomplished by adjusting the thickness and the structure of the epitaxial structure of the micro-LED, so as to optimize the light extraction or the light collimation to comply with the requirement. Besides, a method of fabricating micro-LED array is also accomplished by adding a sacrificial layer in a certain step and a certain position of the LED, so as to simplify the overall fabricating process. Moreover, a micro-LED array is accomplished for adjusting the external field distributions to achieve high light extraction. In addition, a smart micro-projection device having a feedback mechanism according to projected images is also accomplished, so as to adjust the quality of projected images and reduce the unnecessary energy loss.

Embodiments of the present disclosure will be described below. However, these embodiments are not intended for limiting the scope of the disclosure. Besides, some of the embodiments may be combined appropriately to produce other different embodiments of the present disclosure.

First Embodiment

In this present embodiment, a micro-light-emitting diode (LED) array is accomplished by adjusting the thickness and the structure of the epitaxial structure of the LED, so as to optimize the light extraction or the light collimation to comply with the requirement.

FIG. 1 is a schematic cross-sectional view of micro-LED array according to the first embodiment of the present disclosure. It should be noted that, the micro-LED array 200 has a plurality of micro-LEDs arranged in an array and monolithically integrated, and in order to describe clearly, FIG. 1 merely shows the cross-sectional structure of one micro-LED in the micro-LED array. Referring to FIG. 1, the micro-LED 210 of the present embodiment includes a reflective layer 220 and a light-emitting unit 240, wherein the light-emitting unit 240 includes, for example, a P-type epitaxial layer 242, an N-type epitaxial layer 246, and a multiple quantum well (MQW) 244 (i.e. a light emission layer) sandwiched between the two epitaxial layers. In an embodiment, the width W of the micro-LED 210 is about 10 microns.

The surface 230 of the light-emitting unit 240 has a structure of photonic crytal structure 250 for tuning the optical characteristics of emitted light by arranging different refractive indices periodically. In detail, the photonic crytal structure 250 has periodically arranged micro-protrusions structure. However, in other embodiments, the photonic crystal structure 250 may have non-periodically arranged micro-protrusions structure. Because of periodically arranged refractive indices, an electromagnetic wave has Bragg diffraction and interference phenomenon, which results in refraction path changing of the light, so as to reduce the total reflection of the light. As such, percentages of the light intensity emitted outside the micro-LED is relatively increased, and thus the light extraction efficiency can be effectively improved.

More specifically, the light transmitted between the photonic crystal structure 250 and the reflective layer 220 may perform a micro-cavity effect (resonant light emission). The light-emitting unit 240 is capable of emitting a light having wavelength $\lambda_0$, and an optical thickness T between the surface 230 of the light-emitting unit 240 and the reflective layer 220 is related to the wavelength of the standing wave emitted from the light-emitting unit 240. For instance, the optical thickness T and the wavelength $\lambda_0$ of the light substantially satisfy the following formulas (1) and (2):

$$\text{microcavity scheme: } T < n\lambda_0 \tag{1}$$

$$\text{standing wave effect: } T \sim (\lambda_0/2n)*m + (\lambda_0/4n) + \phi \tag{2}$$

In formula (1) and (2), m represents a positive integer, n representes an index of refraction, and $\phi$ is phase shift due to interface between semiconductor and air or the reflective metal. The light emitted from the micro-LED 210 is capable of performing high collimation by adjusting the optical thickness T and a distance between the light emission layer and the reflective layer, which should also satisfy the formula (2). The tolerance of T and the distance between light emission layer and the reflective layer is allowed within a range of $\lambda_0/8n$.

Referring to FIG. 1, since the chip size of the micro-LED 210 in micrometer scale has a function of micro-cavity resonance, the light extraction and the collimation of the micro-LED 210 can be adjusted to comply with requirement by collocating the micro-cavity resonance and Bragg diffraction produced by periodically structure of the photonic crystal structure. Specifically, size and periodicity of the periodically structure of the photonic crystal structure 250 can be adjusted appropriately in accordance with the required light extraction and the required collimation.

FIG. 2A is a light extraction efficiency and light intensity distribution curve diagram of lights emitted from micro-LEDs, in which there are micro-LEDs having different periodically structures. Here, the micro-LED may represent the micro-LED 210 shown in FIG. 1. The range of the light emission angle θ in light intensity distribution curve diagram is from 0 to +180 degrees. The 90 degree represents the direction of the normal to the LED surface. In this embodiment, size and periodicity of the periodically structure of the photonic crystal structure is named as a lattice constant. Referring to FIG. 2A, not only the light extraction efficiency but also the light shapes of the emitted light under the conditions that the lattice constants a ranges from 250 nm to 500 nm are shown.

As shown in FIG. 2A, when the lattice constant a of the photonic crystal structure changes, both the light extraction efficiency and the light intensity distribution curve diagram which represents the collimation of the emitted light change accordingly. In detail, when the lattice constant a of the photonic crystal structure is substantially equal to 425 nm, the micro-LED has a relative high light extraction and the light emission angle θ of the light is gathered toward around 90 degree. Moreover, as shown in FIG. 2A, when the lattice constant a of the photonic crystal structure is substantially equal to 450 nm, the micro-LED performs an excellent collimation. Hence, the micro-LED having the lattice constant 450 nm performs may be used for laser application by utilizing excellent collimation, even though the light extraction efficiency thereof performs not so well. Therefore, to fit different requirements for different application, size and periodicity of the periodically structure of the photonic crystal structure can be adjusted appropriately in accordance with the required light extraction and the required collimation, this disclosure is not limited the range of the lattice constant a.

Figure 2B:
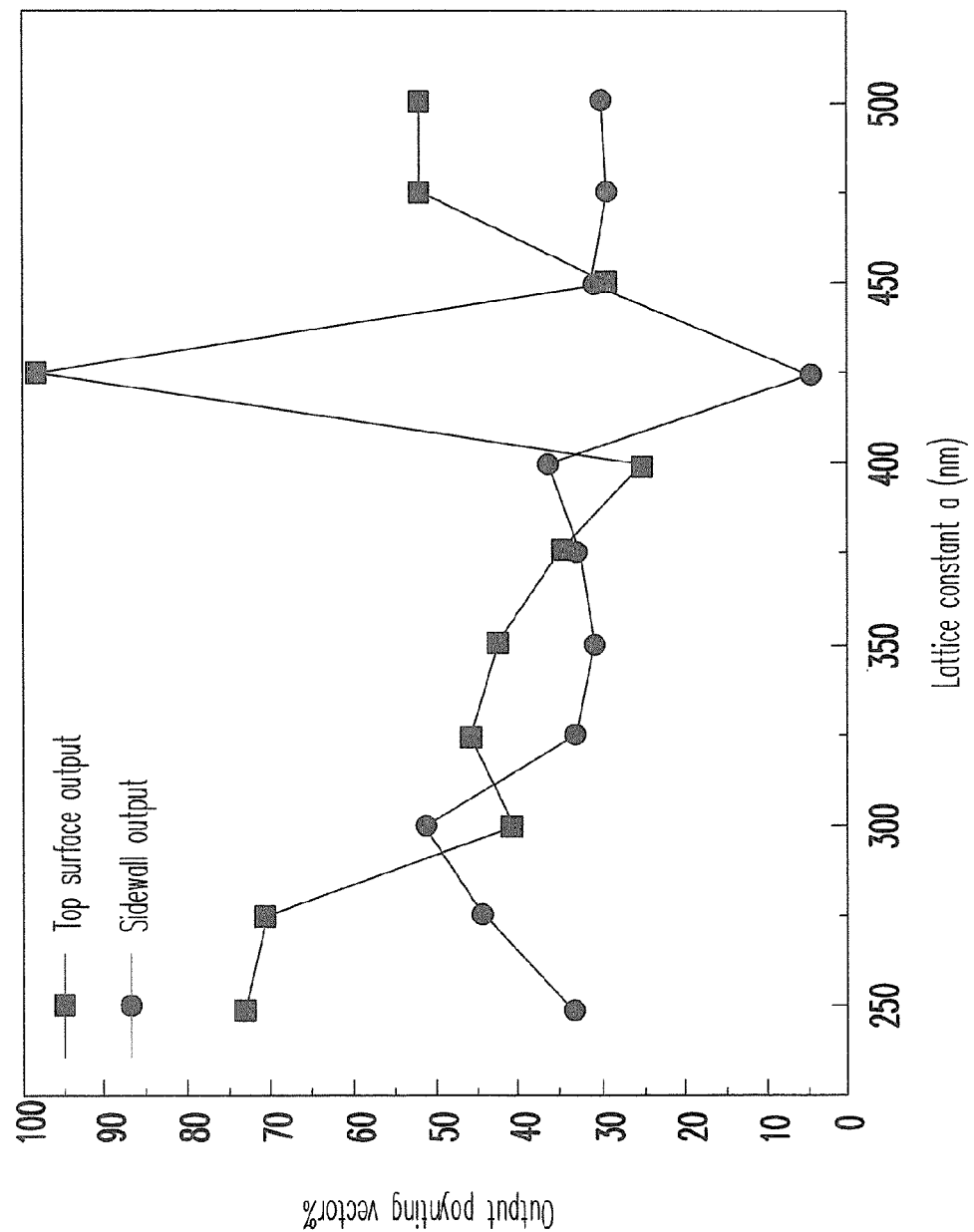
FIG. 2B is a diagram showing a percentage of light intensity emitted from the top surface of the LED relative to the whole energy of the point light source and a percentage emitted from the side surface of the LED relative to the whole energy of the point light source, in which the LEDs having different lattice constant.

FIG. 2B is a diagram showing a percentage of light intensity emitted from the top surface of the micro-LED relative to the whole energy of the point light source, and showing a percentage emitted from the sidewall surface of the micro-LED relative to the whole energy of the point light source, in which the micro-LEDs having different lattice constant a. Here, the micro-LED may represent the micro-LED 210 shown in FIG. 1. Referring to FIG. 2B, by choosing an appropriate lattice constant a of photonic crystal structure, the percentage of light intensity emitted from the top surface of the micro-LED can almost achieve to 100%. For example, when the lattice constant a of the photonic crystal structure is substantially equal to 425 nm, the percentage of light intensity emitted from the top surface of the micro-LED can almost reach to 100%. In the meanwhile, referring to the light intensity distribution curve diagram shown in FIG. 2A, the micro-LED also perform a collimated light, wherein the light emission angle θ of the light is gathered toward around 90 degree as shown in FIG. 2A.

Second Embodiment

In this present embodiment, a method of fabricating micro-LED array is accomplished by adding a sacrificial layer in a certain step and a certain position of the micro-LED, so as to simplify the overall fabricating process of micro-LED array having high light extraction and high light collimation.

FIGS. 3A through 3E are schematic cross-sectional views illustrating the process flow of the micro-LED array according to the second embodiment of the present disclosure.

Figure 3A:
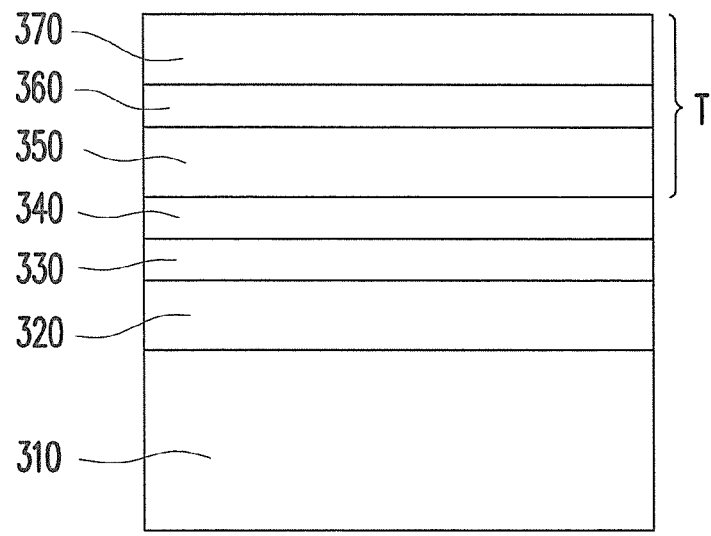
FIGS. 3A through 3E are schematic cross-sectional views illustrating the process flow of the micro-LED array according to the second embodiment of the present disclosure.

Referring to FIG. 3A, a substrate 310 is provided first. A material of the substrate 310 is sapphire, for example. Further, a sacrificial layer 340 is added in the epitaxial stacked layer predetermined to form micro-LED structure, so that the micro-LED 300 can easily achieve a required thickness of the micro-cavity resonance. More specially, an undoped GaN (un-GaN) layer 320, a first n-type doping GaN (n-GaN) layer 330, a sacrificial layer 340, a second n-GaN layer 350, a MQW layer 360, and a p-type doping GaN (p-GaN) layer 370 are formed on the substrate 310 in sequence. In the embodiments, a material of the sacrificial layer 340 can be chosen on a basis of having a lattice constant similar to GaN, such as AlInN or a compound having high-quantity Al therein. Since the lattice constants of the sacrificial layer 340, i.e. AlInN, and the lattice constants of GaN match, a desired thickness of micro-cavity resonance may grow on the sacrificial layer 340. It should be noted that, the concept of the desired thickness of micro-cavity resonance T is like the optical thickness as mentioned in the first embodiment. In this embodiment, the desired thickness T of micro-cavity resonance may satisfy the foregoing formulas (1) and (2). Here, the desired thickness T of micro-cavity resonance means a total thickness of the second n-GaN layer 350, the MQW layer 360, and a p-GaN 370 shown in FIG. 3A.

Figure 3B:
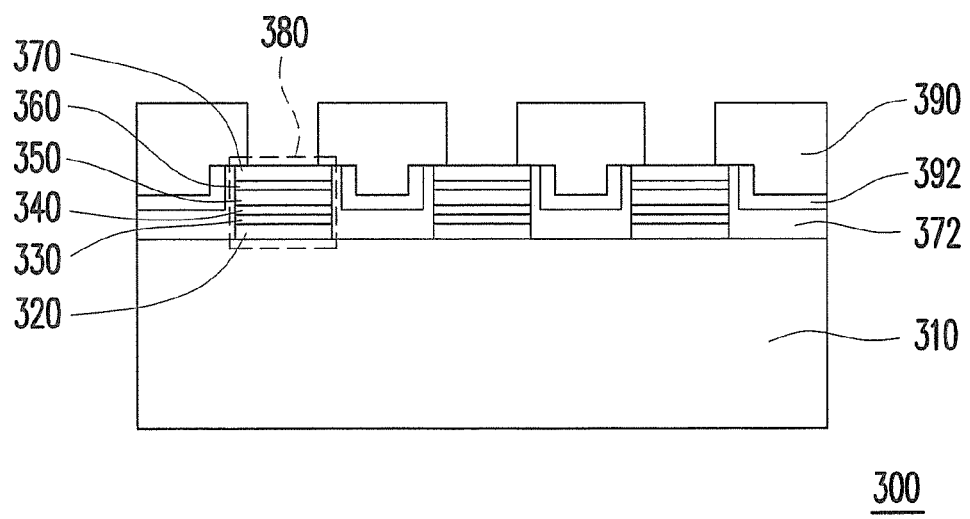

Next, referring to FIG. 3B, a plurality of micro-LED predetermine structures 380 arranged in an array are fabricated on the substrate 310 by photolithography process, and form a micro-LED array substrate 300. A silicon oxide layer 372 is formed on the substrate 310 between adjacent micro-LED predetermine structures 380. Further, a patterned passivation 390 is formed to cover the plurality of micro-LED predetermine structures 380, wherein the patterned passivation 390 is disposed on the side edges of each micro-LED predetermine structure 380, so as to reduce the formation of leakage current. In addition, the patterned passivation 390 exposes the top surface of each LED. Moreover, to further enhance the light emitted from the top surface of LEDs, a metal reflective layer 392 may be further formed at side edges of each micro-LED predetermine structure 380 before the formation of patterned passivation 390 and after the formation of silicon oxide layer 372.

Figure 3C:
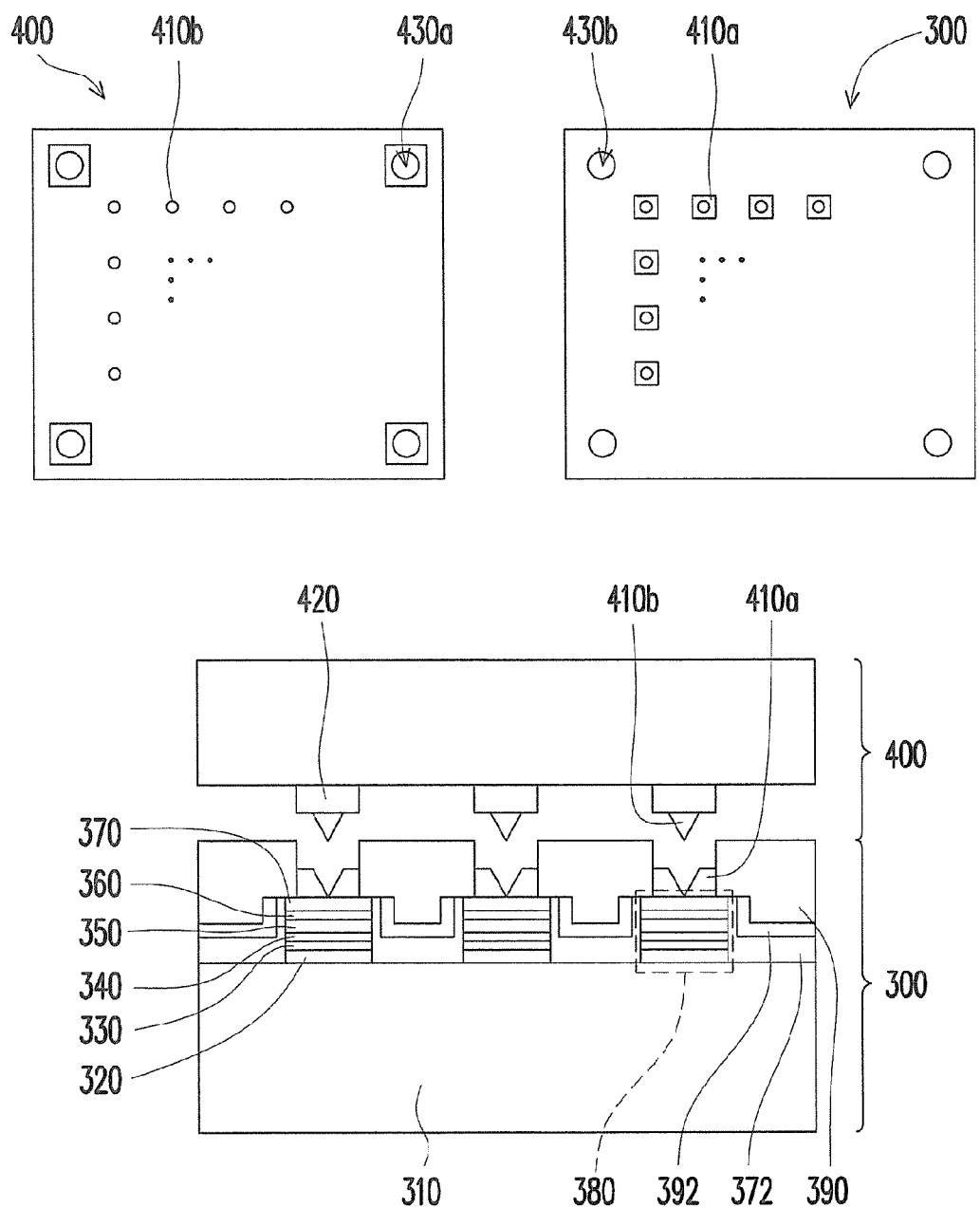

Then, referring to FIG. 3C, a complementary metal-oxide-semiconductor (CMOS) circuit substrate 400 having a plurality of CMOS 420 arranged in an array is provided. The CMOS circuit device 400 is aligned to the micro-LED array substrate 300 by using alignment 430a and 430b marks marked on the peripheral, for example. After aligning, the CMOS circuit device 400 is assembled to the micro-LED array substrate 300. At this moment, in the display region, the CMOS circuit device 400 is bond to the micro-LED array substrate 300 by utilizing two conductive clamping portions with different shapes respectively arranged on the CMOS 420 and the micro-LED 380. In detail, a first conductive pattern 410a is formed on the top surface of each LED exposed by the pasivation 390, and a second conductive pattern 410b is formed on the top surface of each CMOS corresponding to each LED, and a material of the conductive patterns may be metal or indium tin oxide (ITO). Since shapes and positions of the first conductive pattern 410a and the second conductive pattern 410b are complementary, so that the CMOS circuit device 400 and the micro-LED array substrate 300 can be mutually fit. In this embodiment, the first conductive pattern 410a disposed on each micro-LED predetermine structure 380 has a triangle cavity, and the second conductive pattern 410b disposed on each CMOS 420 has a corresponding triangle protruding. The micro-LED array substrate 300 and the CMOS circuit device 400 are assembled to each other through clamping the first conductive pattern 410a and the second conductive pattern 410b having complementary shapes. To enhance the bonding strength between the first conductive pattern 410a and the second conductive pattern 410b, a heating process is further performed to arise the temperature of the first conductive pattern 410a and the second conductive pattern 410b toward the eutectic point, so as to melt first conductive pattern 410a and the second conductive pattern 410b.

Figure 3D:
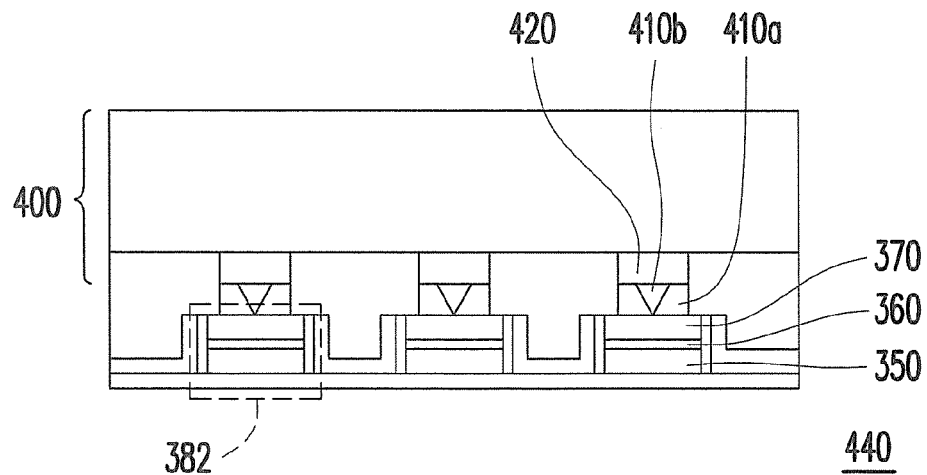
Figure 3E:
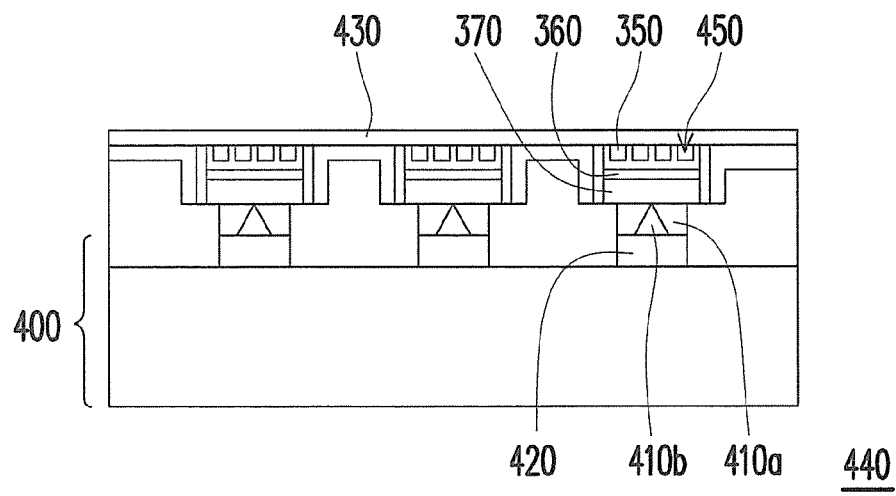

Next, the silicon oxide layer 372 around the LEDs is removed by performing an etching process, so as to expose the sacrificial layer 340 from side edges of each micro-LED predetermine structure 380, wherein the etching process is wet etching, for example. Afterwards, referring to FIG. 3D, an electrolytic oxidation process is performed to oxidize the sacrificial layer 340. For instance, when the material of the sacrificial layer 340 is AlInN, AlInN can be oxidized by electrolytic solution like NTA:KOH to form $(AlInN)O_x$. Thereafter, the assembled micro-LED array substrate 300 and the CMOS circuit device 400 is immersed into an etching solution, such as a heated nitric acid ($HNO_3$) solution. The oxidated sacrificial layer 340, i.e. $(AlInN)O_x$, is then removed by the heated nitric acid ($HNO_3$) solution, and the layers disposed at two sides of the oxidated sacrificial layer 340 are separated from each other accordingly. That is to say, referring to FIGS. 3C and 3D, the substrate 310, the un-GaN layer 320 and the first n-GaN layer 330 are removed due to the removed sacrificial layer 340, and the second n-GaN layer 350 becomes the top surface of the micro-LED array as shown in FIG. 3D. As such, a stacked structure of the second n-GaN layer 350, the MQW layer 360, and the p-GaN layer 370 constitute a micro-LED 382. Then, a ITO layer 430 is selectively formed on the second n-GaN layer 350, as shown in FIG. 3E. Hence, the micro-LED array 440 is almost completed.

Referring to FIG. 3E, before the step of forming ITO layer 430, a photonic crystal structure 450 is first formed on a surface of the second n-GaN layer 350, facing away from the MQW layer 360, of each micro-LED 382 by optical holography process or nanoimprint process, so as to enhance light extraction efficiency and collimation. In other embodiments, a photonic crystal structure may also be formed on a surface of the p-GaN layer 370 facing away from the MQW layer 360, or photonic crystal structures are formed on both the surfaces of the second n-GaN layer 350 and the p-GaN layer 370. In this embodiment, the photonic crystal structure 450 is formed by directly forming a periodically cavity of the top surface of the second n-GaN layer 350. Upon the completion of photonic crystal structure 450 on each micro-LED 382, it can directly use the second GaN layer 350 to serve as a common negative electrode, or further form a ITO layer, thin metal layer or metal mesh electrode having openings respectively corresponding to the micro-LEDs 382 to serve as the common the negative electrode, this disclosure is not limited to.

Therefore, a micro-LED array 440 having high light extraction efficiency and collimation can be fabricated by the above-mentioned process flow. By arranging a sacrificial layer in a proper step and in a proper position, the method of fabricating micro-LED array is no need laser lift-off process, and thus the process can be simplify.

In this present embodiment, a full color micro-LED array is further accomplished in the following description. For better illustration the full color micro-LED array, some diagrams and embodiments are taken as examples to describe one unit of the full color micro-LED array as following, but the embodiments in the follows are not limit the present disclosure.

To achieve full color display, the micro-LED array further comprises a wavelength converting structure. A material of the wavelength converting structure can be nano-phosphors or nano-particles, wherein the nano-phosphor is CdSe/ZmS quantum dots (QDs), for example, and the nano-particle is NaYF4:Yb,Er, for example. By using the nano-phosphors or nano-particles as the wavelength converting structure, a full color display can be achieved, and the scattering phenomenon also can be reduced.

Figure 4A:
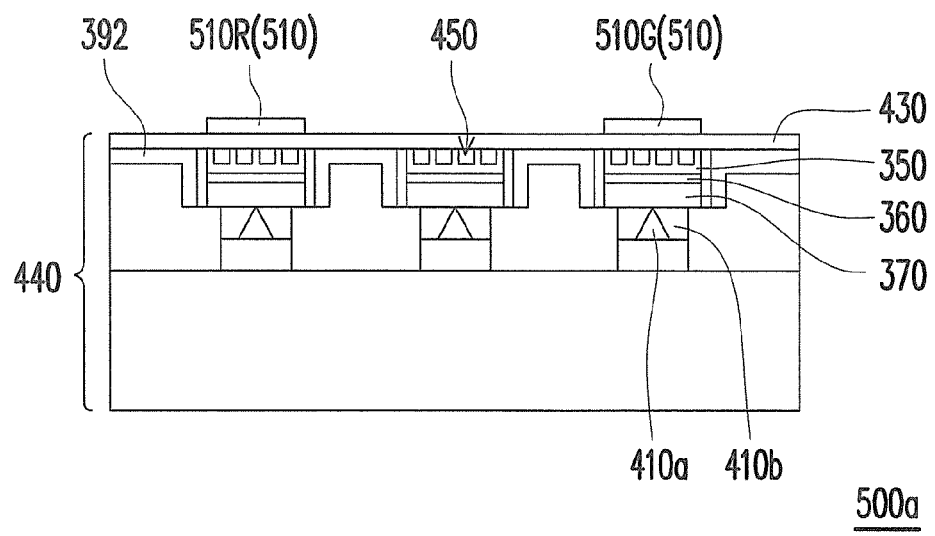
FIG. 4A is a schematic cross-sectional view of an unit in a full color micro-LED array according to the present embodiment of the present disclosure.

FIG. 4A is a schematic cross-sectional view of an unit in a full color micro-LED array according to the present embodiment of the present disclosure. Referring to FIG. 4A, a nano-phosphor layer 510 is formed on the surfaces of two micro-LED in one unit of the micro-LED array 440. More specifically, there are 3 micro-LEDs in one unit of the full color micro-LED array. Since the light emitted from the stacked layer of n-GaN, MQW, and p-GaN is blue in this embodiment, a red nano-phosphor pattern 510R and a green nano-phosphor pattern 510G are respectively formed on two micro-LEDs in one unit, and thus the three micro-LEDs in one unit can respectively emit blue light, green light and red light, so that the micro-LED array 500a can display with full color. A material of the red nano-phosphor pattern 510R is red CdSe/ZmS quantum dots (QDs), and a material of the green nano-phosphor pattern 510G is green CdSe/ZmS QDs, for example. It should be noted that the thickness of the nano-phosphor pattern 510R and 510G are smaller than the wavelength of the emitted light. Referring to the FIG. 4A, the emitted directivity of exciting light of the nano-phosphor can be controlled by the semiconductor waveguide structure and the photonic crystal structure of micro-LEDs.

Figure 4B:
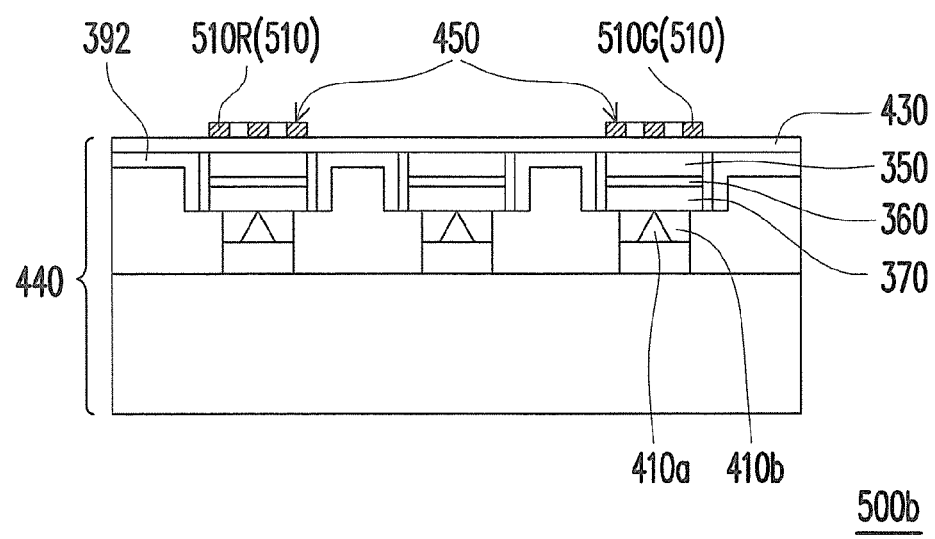
FIG. 4B is a schematic cross-sectional view of an unit in another full color micro-LED array according to the present embodiment of the present disclosure.

FIG. 4B is a schematic cross-sectional view of an unit in another full color micro-LED array according to the present embodiment of the present disclosure. Referring to FIG. 4B, a nano-phosphor layer 510 is formed on the surfaces of two micro-LEDs in one unit of the micro-LED array 440. The unit of micro-LED array 500b in this embodiment is similar to the unit of micro-LED array 500a shown in FIG. 4A. The difference between the unit of micro-LED array 500b and the unit of micro-LED array 500a is that the photonic crystal structure 450 is directly formed by using the red nano-phosphor pattern 510R and the green nano-phosphor pattern 5106, rather than formed by using the second GaN layer 350 of LEDs shown in FIG. 4A. That is to say, the photonic crystal structure 450 in this embodiment is made of the red nano-phosphor pattern 510R and the green nano-phosphor pattern 510G. Hence, the light emitted from micro-LED array 500b can achieve high light extraction efficiency and high collimation through the photonic crystal structure 450.

Figure 4C:
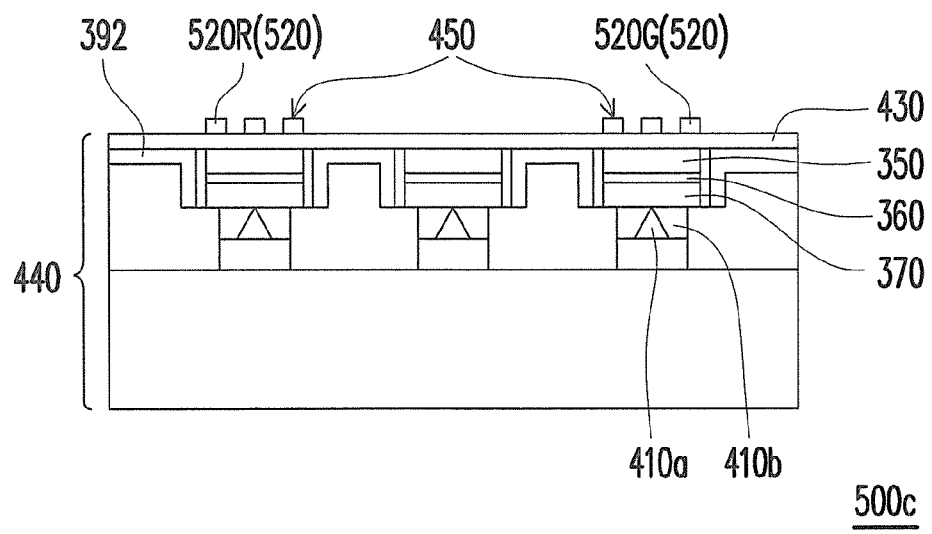
FIG. 4C is a schematic cross-sectional view of an unit in another full color micro-LED array according to the present embodiment of the present disclosure.

FIG. 4C is a schematic cross-sectional view of an unit in a full color micro-LED array according to the present embodiment of the present disclosure. Referring to FIG. 4C, a nanoparticles layer 520 having photonic crystal structure 450 is formed on the surfaces of two LEDs in one unit of the micro-LED array 440. In this embodiment, a red nano-particles pattern 520R and a green nano-particles pattern 520G are respectively formed on two micro-LEDs in one unit, so that the three micro-LEDs in one unit can respectively emit blue light, green light and red light, and thus the micro-LED array 500c can full color display. A material of the red nano-particles pattern 520R is red NaYF4:Yb,Er, and a material of the green nano-particles pattern 520G is green NaYF4:Yb,Er, for example. Referring to the FIG. 4C, the photonic crystal structure 450 is directly formed by using the red nano-particles pattern 520R and the green nano-particles pattern 520G. In other words, the photonic crystal structure 450 in this embodiment is made of the red nano-particles pattern 520R and made of the green nano-particles pattern 520G. By using the photonic crystal structure 450 made by red nano-particles pattern 520R and made of green nano-particles pattern 520G, the light emitted from micro-LED array 500c can achieve high light extraction efficiency and high collimation.

Third Embodiment

In this present embodiment, a micro-LED array is accomplished for adjusting the external field distributions of micro-LEDs, so as to optimize the light extraction and light collimation to comply with the requirement. In some embodiments, the micro-LED array can also reduce the cross-talking.

FIGS. 5A through 5D are schematic cross-sectional views illustrating the process flow of micro optical lens structure of micro-LED array according to the third embodiment of the present disclosure, wherein the micro-LED array in this embodiment further includes the micro optical lens structure, which LEDs are coressponding disposed therein. For better illustration, FIGS. 5A through 5D merely show the micro optical lens structure, and omit micro-LEDs disposed therein. The micro-LED array can be any one of the above-mentioned micro-LED arrays or any other kind of micro-LED arrays, this embodiment is not limited the types of micro-LED array.

Figure 5A:
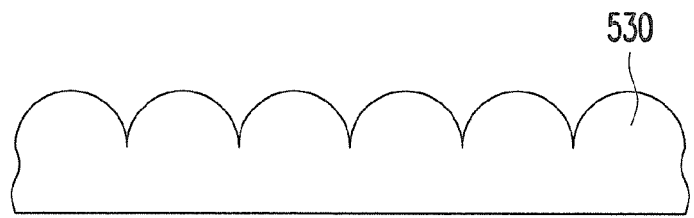
FIGS. 5A through 5E are schematic views illustrating the process flow of micro optical lens structure of micro-LED array according to the third embodiment of the present disclosure.
Figure 5B:
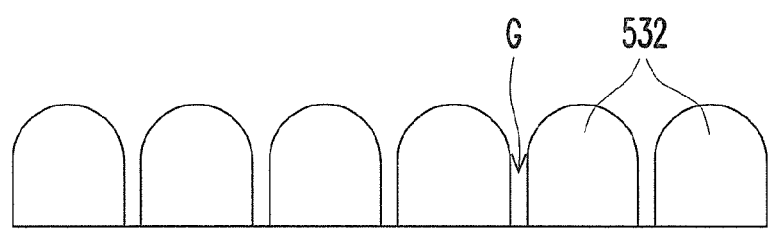

Referring to FIG. 5A, a micro optical lens layer 530 is formed on the micro-LED array by reflow process or other proper process, Next, referring to FIG. 5B, a groove G is formed on the micro optical lens layer 530 by etching process or imprint process, so as to divide the micro optical lens layer 530 into a plurality of micro-lens 532. As shown in FIG. 5B, the micro-lenses 532 are independently.

Figure 5C:
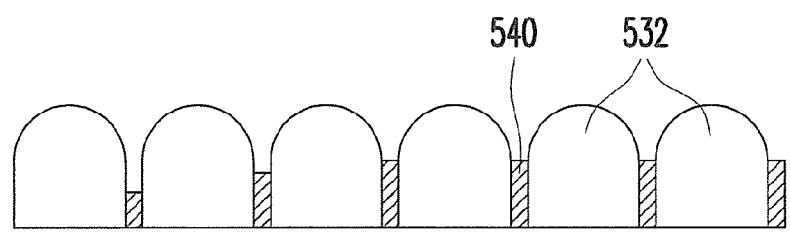
Figure 5D:
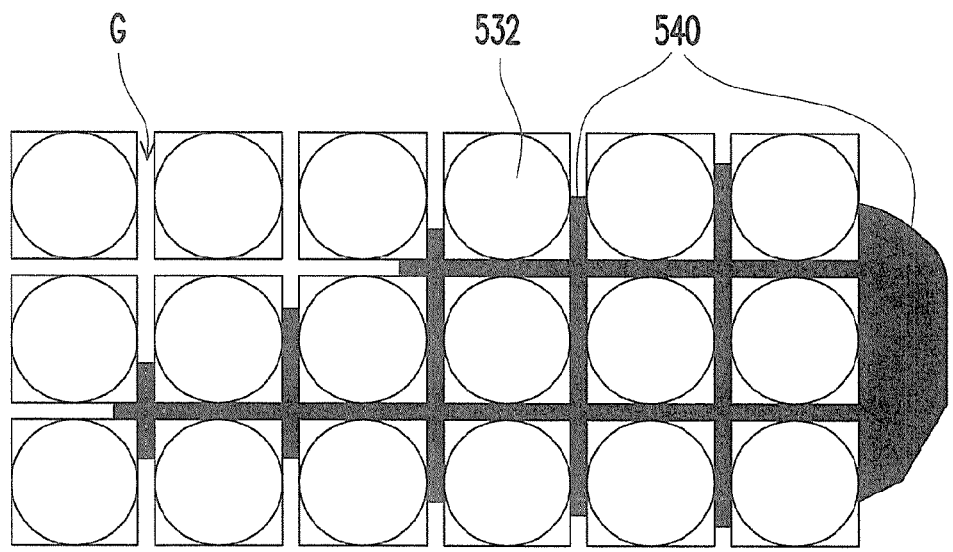
Figure 5E:
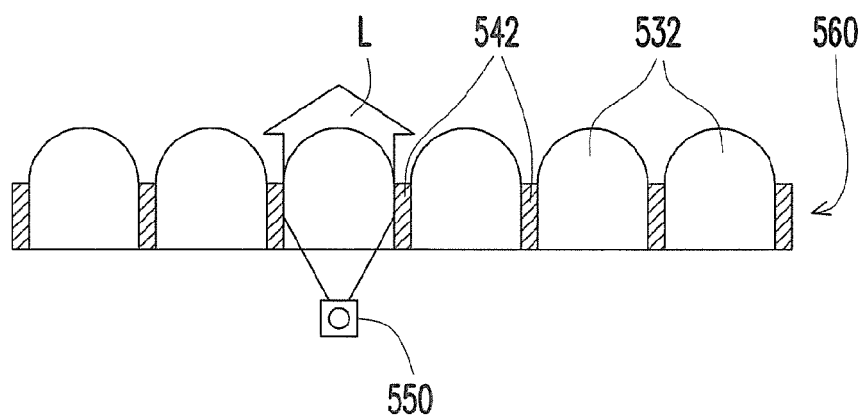

FIG. 5D is a top view illustrating the micro optical lens structure shown in FIG. 5C. Referring to FIGS. 5C and 5C', a partition material 540 is provided to fill the groove G between the adjacent micro-lenses 532 by capillarity phenomenon. The partition material 540 may use a light-shielding material or a light-reflecting material. Next, referring to FIG. 5E, the partition material 540 is cured or solidified to form a partition structure 542. The partition structure 542 and the micro-lenses 532 in this embodiment constitute a micro optical lens structure 560. As shown in FIG. 5E, the partition structure 542 disposed around each lens 532 is capable of enhancing the collimation of light emitted from the LED 550 disposed underneath.

Figure 6A:
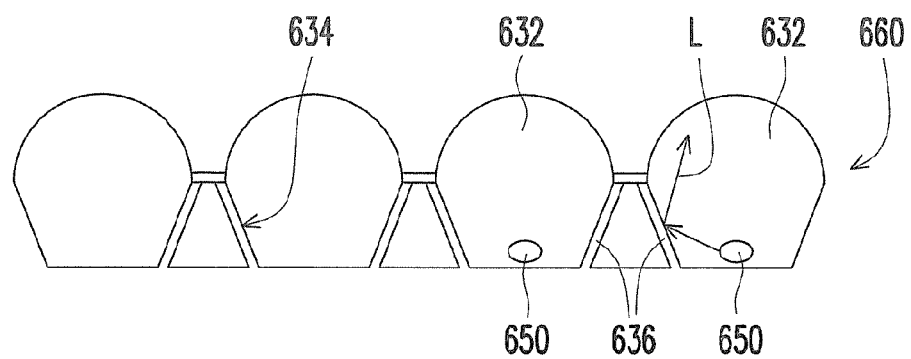
FIG. 6A is a schematic cross-sectional views further illustrating the structure between and inside the micro optical lens structure of micro-LED array according to the third embodiment of the present disclosure.

FIG. 6A is a schematic cross-sectional views further illustrating the structure between and inside the micro optical lens structure of micro-LED array according to the third embodiment of the present disclosure. Referring to FIG. 6A, to reduce the cross-talking phenomenon between the LEDs disposed in micro-lens, a reflective structure 636 for isolating light is further formed between adjacent micro-lenses 632 and formed in the inner part of each micro-lens 632, so as to constitute a micro optical lens structure 660 as shown in FIG. 6A. In this embodiment, the reflective structure 636 is, for example, an air gap. Referring to FIG. 6A, the wall of each micro-lens 632 serves as a totally reflective surface 634, and each LED 650 is disposed inside each micro-lens 632. In practice, the emitted light of LED 650 is reflected toward the top surface of LED when the emitted light is emit to the totally reflective surface 634. Hence, the totally reflective surface 634 of the micro-lens can achieve light-isolating function, and thus improving the light extraction efficiency and the collimation, and further restraining the cross-talking problems between the emitted light of LEDs. Here, the LED 620 may be the foregoing micro-LED or any other type of LED.

Figure 6B:
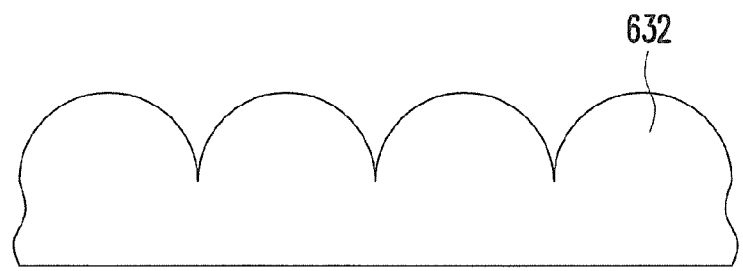
FIGS. 6B and 6C is a schematic views illustrating the method to fabricate the micro optical lens structure shown in FIG. 6A according to the third embodiment of the present disclosure.
Figure 6C:
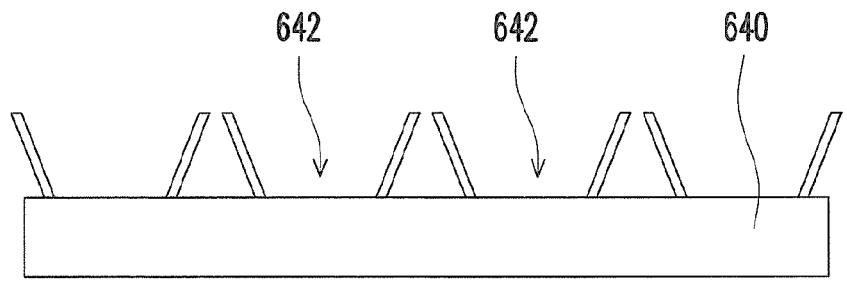

FIG. 6B is a schematic views illustrating the method to fabricate the micro optical lens structure shown in FIG. 6A according to the third embodiment of the present disclosure. Referring to FIG. 6B, a micro optical lens layer 630 is formed on the micro-LED array by reflow process or other proper process. Next, a mold 640 having a plurality of bowl-shaped structure 642 is provided. The micro optical lens layer 630 is stabbed by the mold 640 having a plurality of bowl-shaped structure 642, and thus forms the micro optical lens structure 660 as shown in FIG. 6A.

Figure 7:
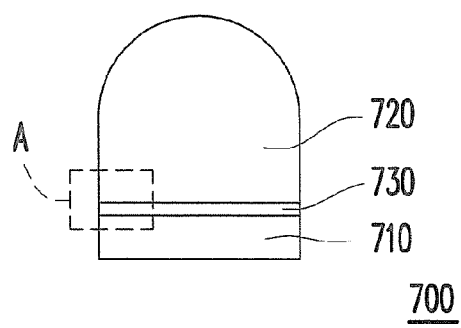
FIG. 7 is a schematic view illustrating one LED package of micro-LED array according to the third embodiment of the present disclosure.

Furthermore, in order to enhance light extraction efficiency, another micro optical lens structures are also accomplished by adjusting the coating process of phosphor layer. FIG. 7 is a schematic view illustrating one LED package of micro-LED array according to the third embodiment of the present disclosure, wherein the LED package 700 includes a micro-LED 710, a micro-lens 720, and a phosphor layer 730 disposed therebetween.

Figure 8A:
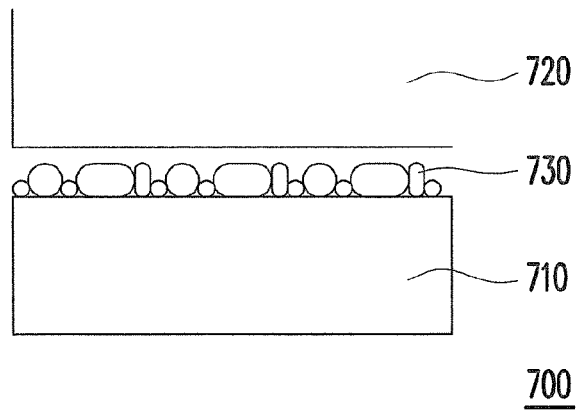
FIGS. 8A and 8B respectively illustrate a partially magnified view of region A of the LED package in FIG. 7 with different coating process of phosphor layer.
Figure 8B:
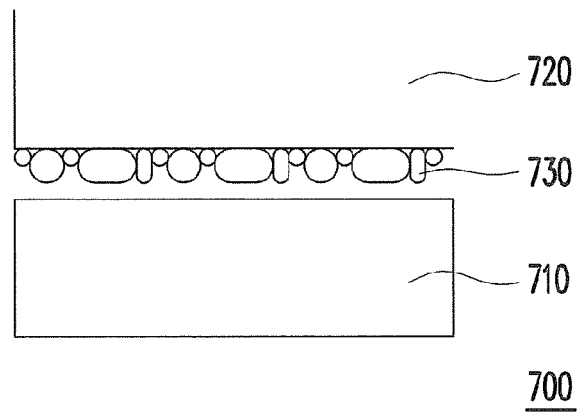

FIGS. 8A and 8B respectively illustrate a partially magnified view of region A of the LED package in FIG. 7 with different coating process of phosphor layer, wherein FIG. 8A illustrates that the phosphor layer 730 is first coated on the micro-LED 710 before assembling the micro-lens 720 to the micro-LED 710, and FIG. 8B illustrates that the phosphor layer 730 is first coated on the micro-lens 720 before assembling the micro-lens 720 to the micro-LED 710. The inventors discover that if coating the phosphor layer 730 onto the micro-LED 710 before assembling the micro-lens 720 to the micro-LED 710 as shown in FIG. 8A, it is easily to produce total reflection in the interface of micro-lens 720 due to the stray light. On the contrary, the light extraction efficiency can be enhanced if coating the phosphor layer 730 onto the micro-lens 720 before assembling the micro-lens 720 to the micro-LED 710 as shown in FIG. 8B, because the phosphor layer 730 on the interface of the micro-lens 720 forms a coarse structure.

Figure 9A:
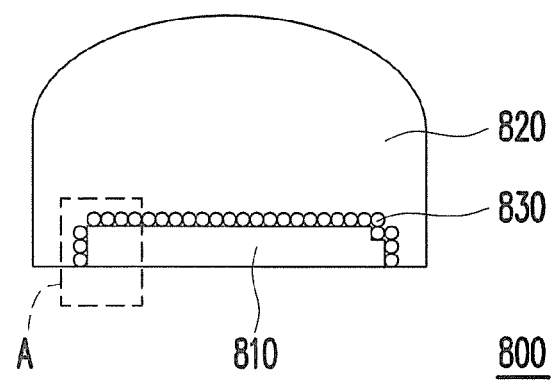
FIG. 9A is a schematic view illustrating another LED package of micro-LED array according to the third embodiment of the present disclosure.
Figure 9B:
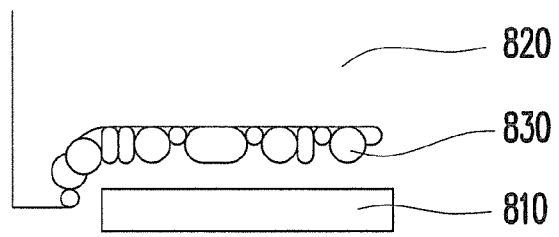
FIG. 9B illustrates a partially magnified view of region A of the LED package in FIG. 9A.

In the same manner, FIG. 9A is a schematic view illustrating another LED package of micro-LED array according to the third embodiment of the present disclosure, and FIG. 9B illustrates a partially magnified view of region A of the LED package in FIG. 9A. Referring to FIGS. 9A and 9B, wherein the LED package 800 includes a micro-LED 810, a micro-lens 820, and a phosphor layer 830 disposed therebetween. Since phosphor layer 830 is first coated onto the micro-lens 820, rather than onto the micro-LED 810, before assembling the micro-lens 820 to the micro-LED 810, so that the light extraction efficiency of the LED package 800 is enhanced.

Fourth Embodiment

In this present embodiment, a smart micro-projection device having a feedback mechanism according to projected images is accomplished, so as to adjust the quality of projected images including brightness and contrast, and reduce the unnecessary energy loss. Moreover, Utilizing a dynamic sensor to detect a relative position, vibration and a relative angle between the projector and the screen, so as to adjust image distortion and reduce image shaking from handheld.

The following disclosure provides an addressable inorganic LED array as a display source for image projection that can be integrated with other functional modules to serve as a micro projection device performing various functions. The display source for image projection provided by the present disclosure can serve as a full-color display source by converting different types of light, e.g. blue light or ultraviolet light, to prime color lights, e.g. blue light, red light and green light, by wavelength converting material. Alternatively, the full-color display can be achieved by assembling a plurality of micro LEDs of prime color light into an LED array, wherein the assembling of the micro LEDs may be implemented by epitaxial growing technique or other techniques. As another alternative, the full-color display can also be achieved by the combination of a white color display source and a resonant cavity structure, for example, a resonant cavity LED (RC LED), to produce prime color lights via wavelength selection. Unlike other display devices, the display source for image projection provided by the present disclosure requires collimation devices such as photonic crystals or micro lenses to help the angle of the emitted lights converge so as to improve the projection efficiency. Accordingly, one embodiment of the addressable inorganic LED array comprises an LED array composed of RC LEDs of blue light, red light and green light and a micro lens array on top of the LED array. The RC LEDs can improve light emitting efficiency and help the angle of the emitted lights converge. The micro lens array can further limit the angle of the emitted lights within 20 degrees.

Figure 10:
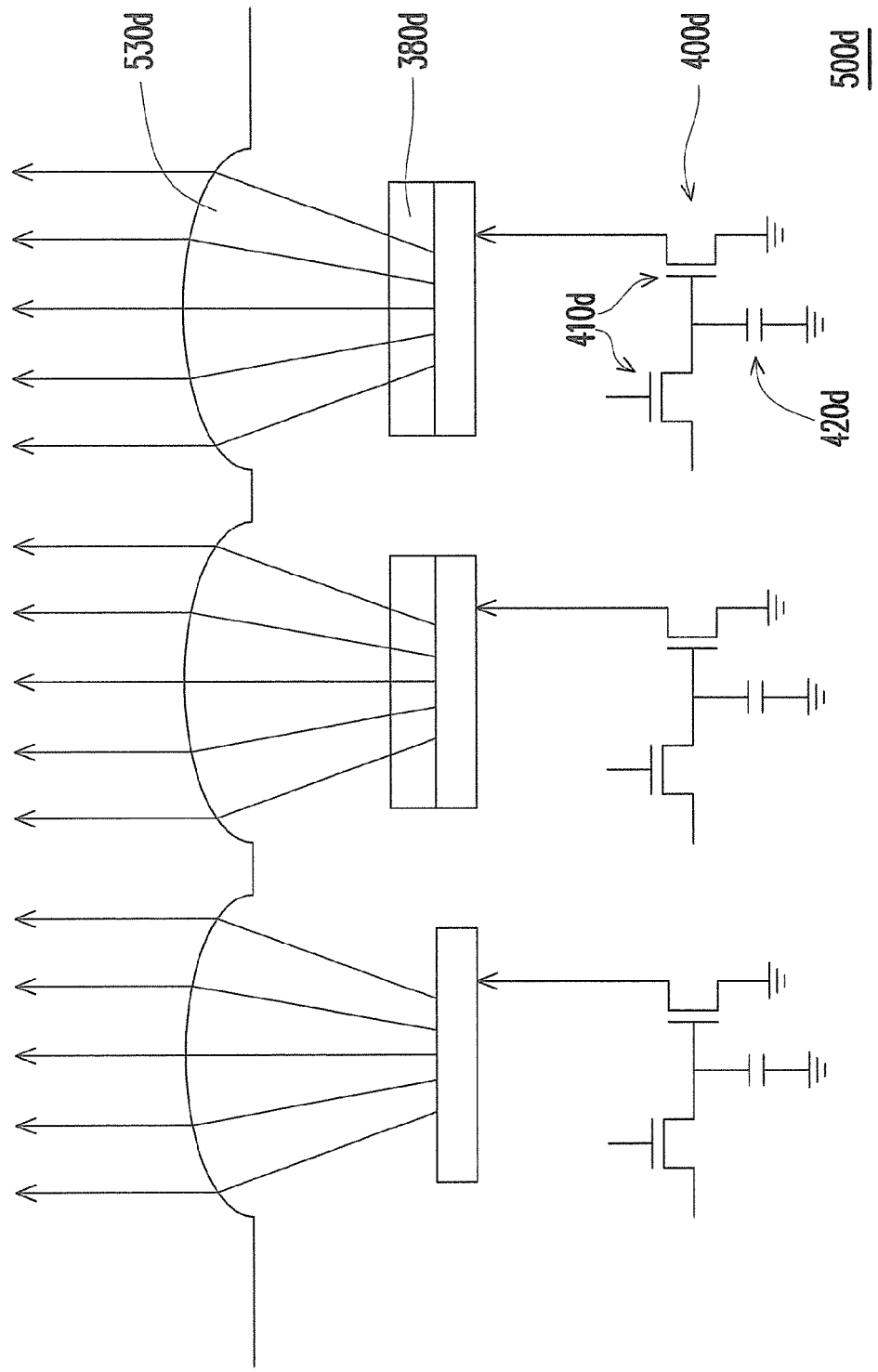
FIG. 10 shows a schematic view of a display source for image projection according to an embodiment of the present disclosure.
Figure 11:
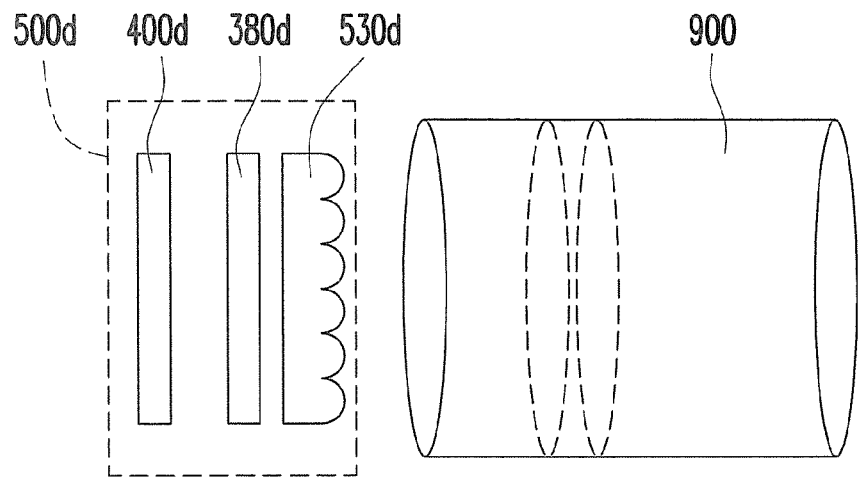
FIG. 11 shows a schematic view of a projection module comprising the display source for image projection according to an embodiment of the present disclosure.
Figure 12:
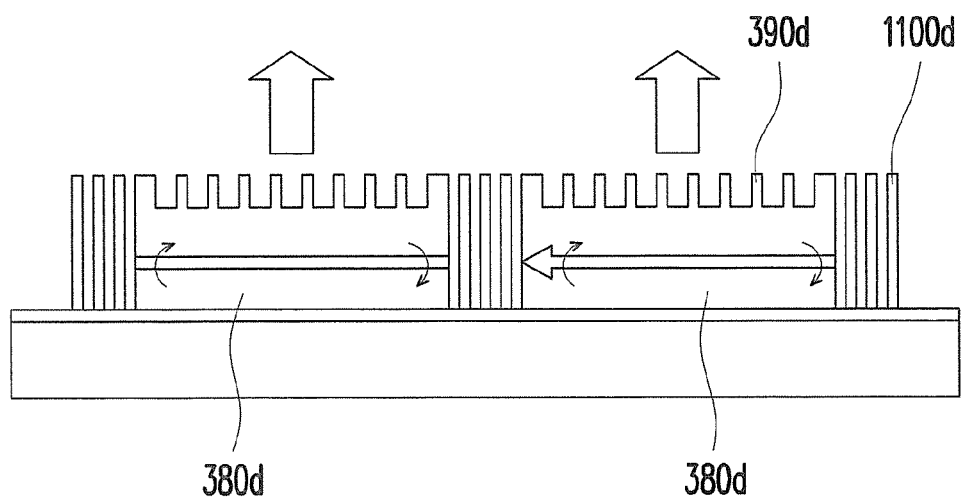
FIG. 12 shows a schematic view of a photonic crystal structure for light separation, extraction and collimation of micro LEDs.

FIG. 10 shows a schematic view of a display source for image projection according to an embodiment of the present disclosure. FIG. 11 shows a schematic view of a projection module comprising the display source for image projection according to an embodiment of the present disclosure. The micro LED array 500d serving as a display source prevents crosstalk among micro display sources. That is, the micro display sources acting as pixels do not interfere with each other and the light fields thereof are collimated. FIG. 12 shows a schematic view of a photonic crystal structure for light separation, extraction and collimation of micro LEDs. Referring to FIGS. 10-12, the micro LEDs 380d is respectively electrically connected to driving circuits 400d including transistors 410d and capacitors 420d, and is covered by a lens array 530d. Driving circuits 400d can be fabricated in silicon or in GaN, the same with light-emitting material. The photonic crystal (PhC) structure 390d, 110d utilizes the band gap effect and Bragg diffraction among its periodic structure for light separation, extraction and collimation of micro LEDs 380d. The photonic crystal structure is designed to exhibit different periodic structures for different applications. For example, when serving as a reflector, the period of the photonic crystal structure 1100d is designed to be half of the wavelength of the propagating light in the material; when serving as collimation device, the period of the photonic crystal structure 390d is designed by taking into account the epitaxial waveguide structure of the LED.

The waveguide characteristics and the photonic crystal structure 390d, 1100d design principles of the LED are described as follows. The dielectric constant of a photonic crystal material or structure varies periodically within the range of the wavelength of the emitted light. According to the diffraction theory, when establishing a photonic crystal structure on the top of an LED semiconductor structure 380d, the light trapped in the LED semiconductor structure 380d will be guided to the air due to the periodic structure of the photonic crystal structure, and the direction of guidance is based on the variation of the period. Therefore, in addition to improving light extraction efficiency, the photonic crystal technique can also adjust the direction of the light field. Because most of the light emitted from the active light emission layer (i.e. MQW) is propagating in or absorbed by the material due to total internal reflection (TIR), the LED 380d exhibits lower external quantum efficiency. According to the waveguide theory, the light trapped in the LEDs 380d exhibit different distributions known as guided modes. The interaction of a photonic crystal structure 390d, 1100d with light is affected significantly by these guided modes. Identical photonic crystal structures interacting with different guided modes exhibit different light extraction efficiencies. Typically, photonic crystal structures 390d, 1100d interacting with high order guided mode have high light extraction efficiency, while photonic crystal structures 309d, 1100d extract low order guided mode (e.g. fundamental mode) with low light extraction efficiency due to the small overlap of the field distribution and the photonic crystal structures 309d, 1100d. Since most of the LED light emission energy is coupled to lower order guided modes, design of a photonic crystal structure 390d that improves light extraction efficiency and the collimation of far field light formation is aided by considering the guided modes in a semiconductor structure.

Figure 13A:
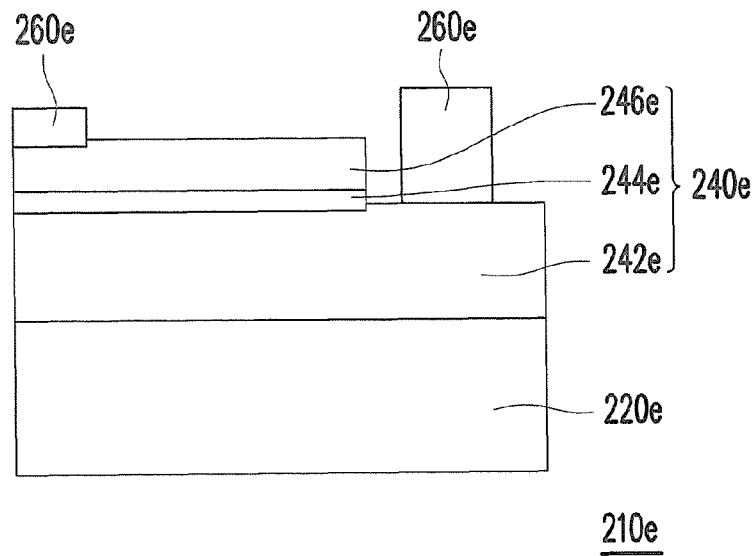
FIGS. 13A and 13B shows a schematic cross section of the epitaxial structure of a regular LED and a photonic (PhC) LED.
Figure 13B:
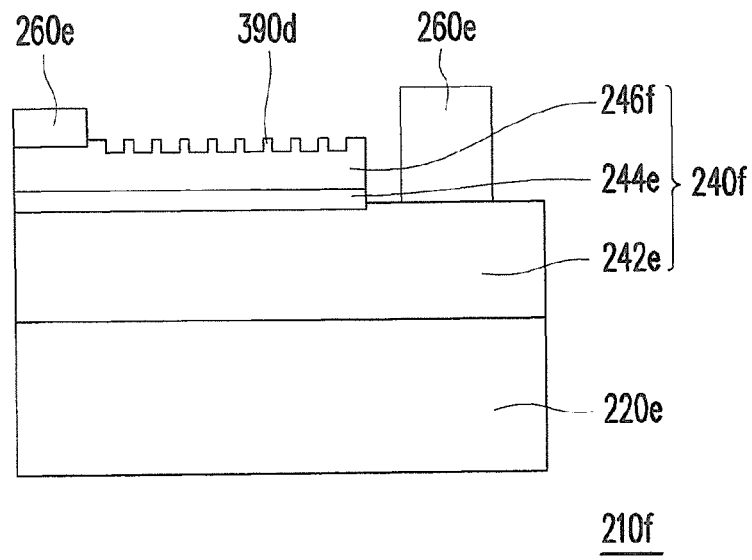
Figure 14A:
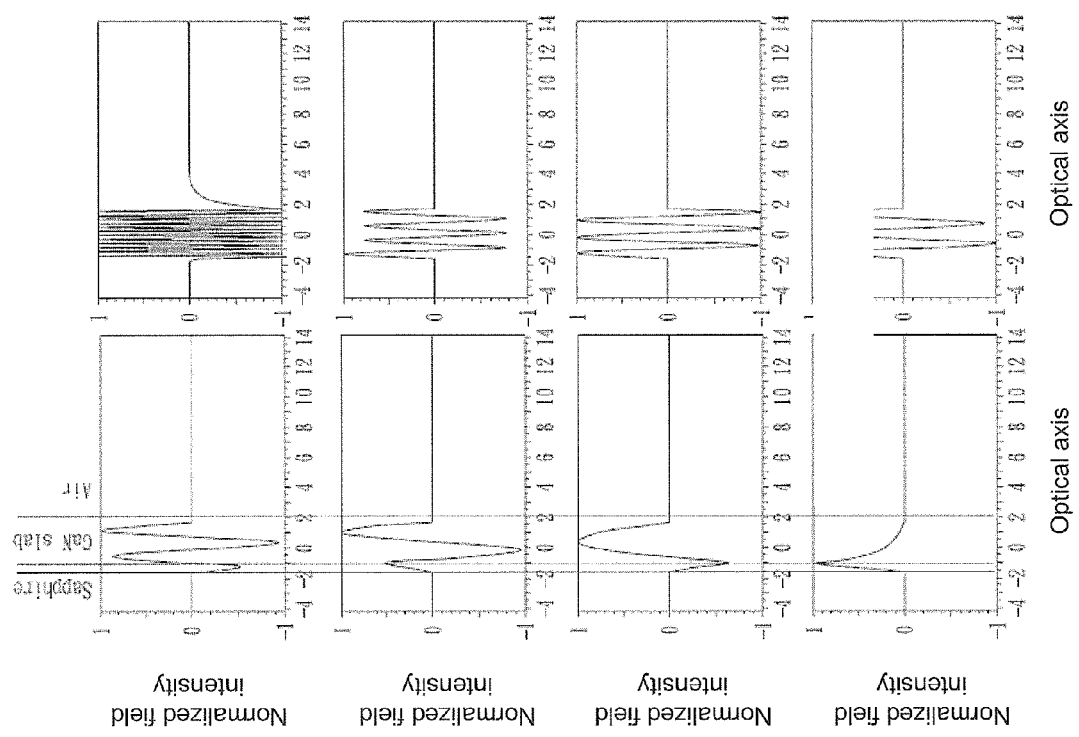
FIG. 14A shows the field distribution of seven lowest order modes and the highest order mode of the slab waveguide structure.
Figure 14B:
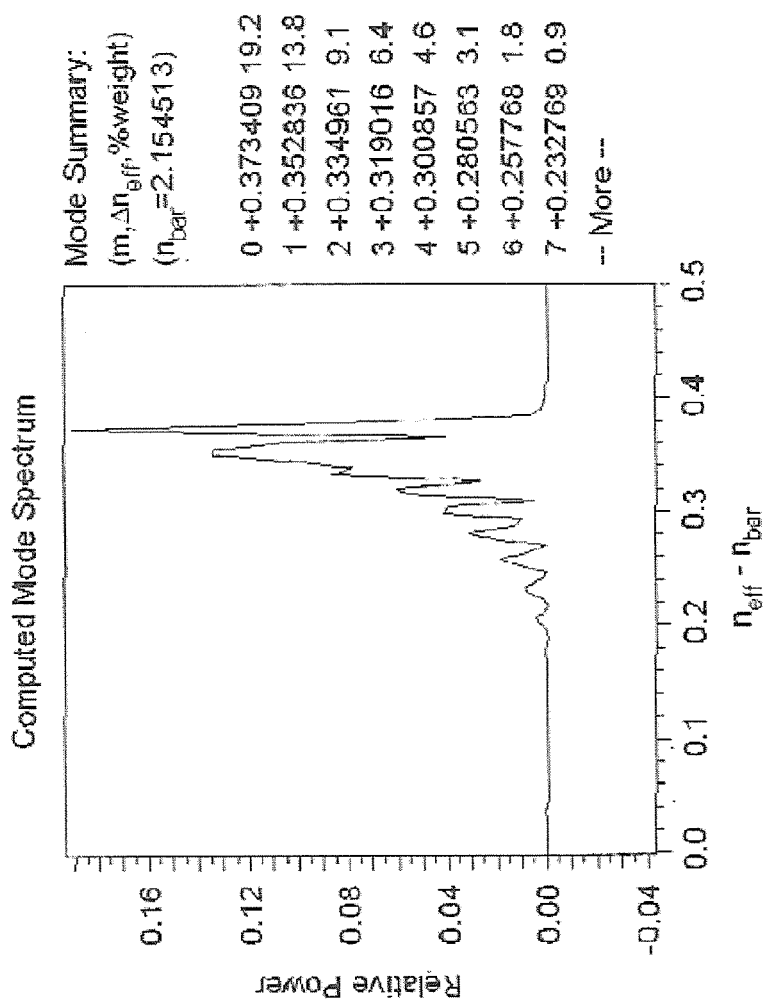
FIG. 14B shows the weight of several excited modes.

FIGS. 13A and 13B shows a schematic cross section of the epitaxial structure of a regular LED and a photonic (PhC) LED. For example, the epitaxial layer structure of a GaN LED is shown in FIG. 13A. The GaN layer 240e, with thickness of three micrometers, is epitaxially grown on a sapphire 220e. The light emission layer 244e is near the top of the GaN layer 240e. Specifically, the GaN layer 240e includes a first doped type GaN layer 242e, a second doped type GaN layer 246e, and the light emission layer 244e disposed between the first doped type GaN layer 242e and the second doped type GaN layer 246e. An electrode 260e is disposed on the first doped type GaN layer 242e, and another electrode 262e is disposed on the second doped type GaN layer 246e. The GaN LED 210e exhibits an asymmetric slab waveguide structure, wherein most of the light emission energy is in waveguide modes and is constrained in the slab waveguide structure. FIG. 14A shows the field distribution of guided modes in the asymmetric slab waveguide. FIG. 14B shows the weight of several excited modes. The mode distributions and weights, affected by the location of the light emission layer, are shown in FIG. 14. FIG. 14A shows the field distribution of seven lowest order modes and the highest order mode of the slab waveguide structure. FIG. 14B shows the mode weight: the weight of the fundamental mode is 19.2%, and the weight of the following excited modes are 13.8%, 9.1%, 6.4%, 4.6%, 3.1%, etc. It can be seen that the most of the waveguide energy is at the low order modes. The photonic crystal LED shown in FIG. 13B utilizes its periodically formed apertures 390d, which diffract its guided modes, to improve light extraction efficiency and to control the far field light formation. It should be noted that the photonic crystal structure 390d has higher light extraction efficiency at high order modes. For the photonic crystal to exhibit higher light extraction efficiency and a better control of the collimation behavior at these modes, the interaction of the photonic crystal at the low order modes should be increased. There are at least two approaches to achieving this goal: increasing the depth of the apertures 390d and decreasing the thickness of the LED epitaxial layer.

A photonic crystal is a device with surface grating. A diffraction theory is utilized to analyze effects of the period of the photonic crystal structure on light extraction. The Bragg diffraction theory is as follows:

$$k_g \sin \theta_1 + mG = k_0 \sin \theta_2,$$

wherein $k_g$ represents the wave vector of guided mode, G represents the diffraction vector of the photonic crystal, $k_o$ represents the wave vector of air and m represents the diffraction order.

For guided mode in which light is trapped in the epitaxial layer of the LEDs, an inverse wave vector can be provided by the diffraction vector G such that the light can enter the air by diffraction. The diffraction vector G depends on the period of the photonic crystal. Typically, for diffraction most guided modes into the air, the period a of the photonic crystal should be greater than two thirds of the wavelength. Accordingly, considering the light extraction efficiency, the period a of the photonic crystal should satisfy the inequality: $a/\lambda \geq 2/3$.

The diffraction theory and finite difference time domain (FDTD) numerical method are used for investigation of the effect of photonic crystal on LED far field light formation. As mentioned earlier, photonic crystal diffract the light trapped in the LED (guided mode) into the air to improve the light extraction efficiency. In addition, according to the diffraction theory, the diffracted angle depends on the period of the photonic crystal. Accordingly, we can control the LED light formation by adjusting the period of the photonic crystal.

Figure 15:
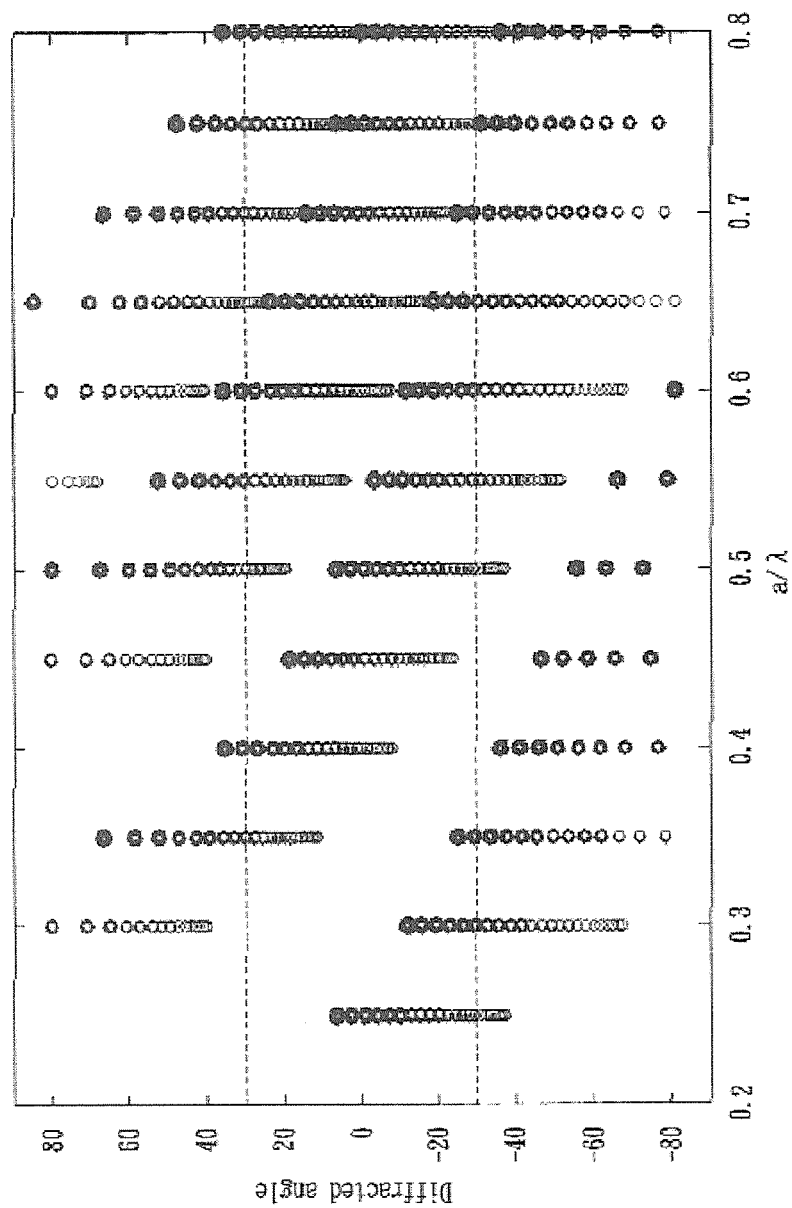
FIG. 15 shows the diffracted angle distributions of guided modes (circles) as a function of normalized frequency (a/λ).
Figure 16B:
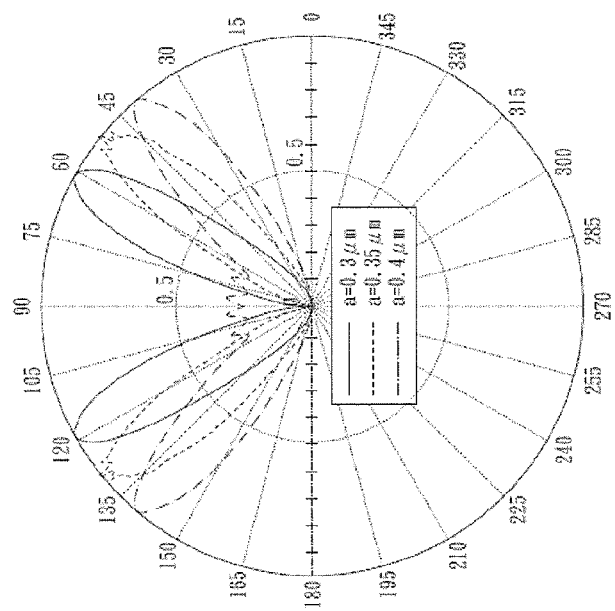
FIGS. 16A through 16F shows far field patterns simulated by FDTD as function of normalized frequency.
Figure 16A:
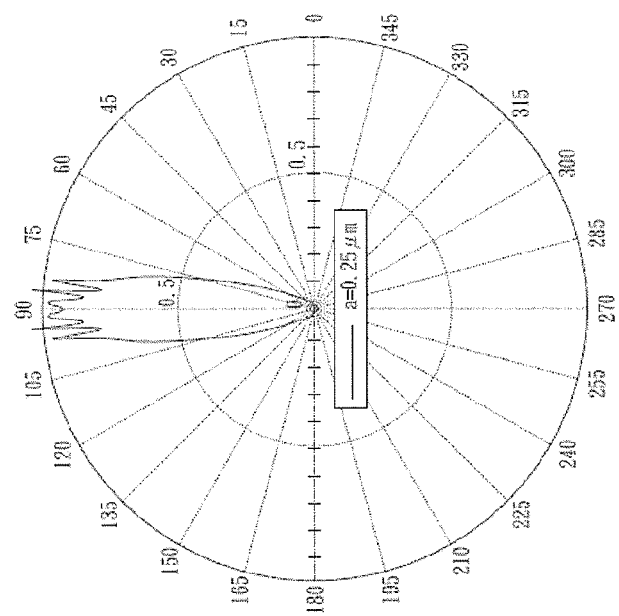
Figure 16D:
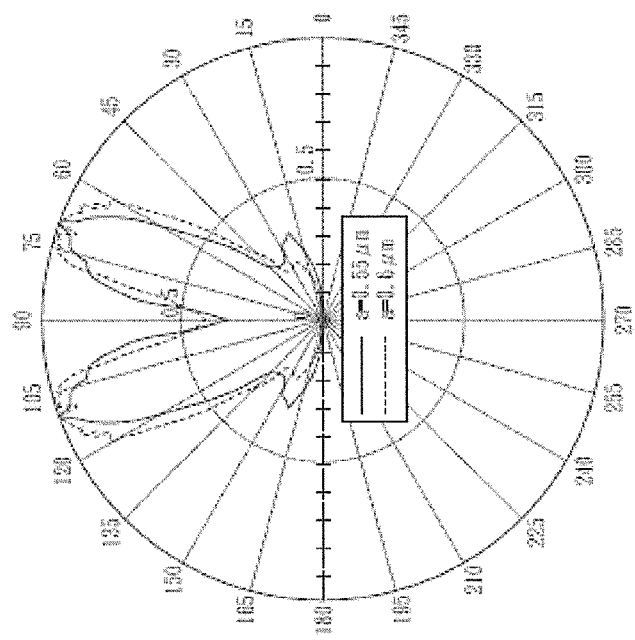
Figure 16C:
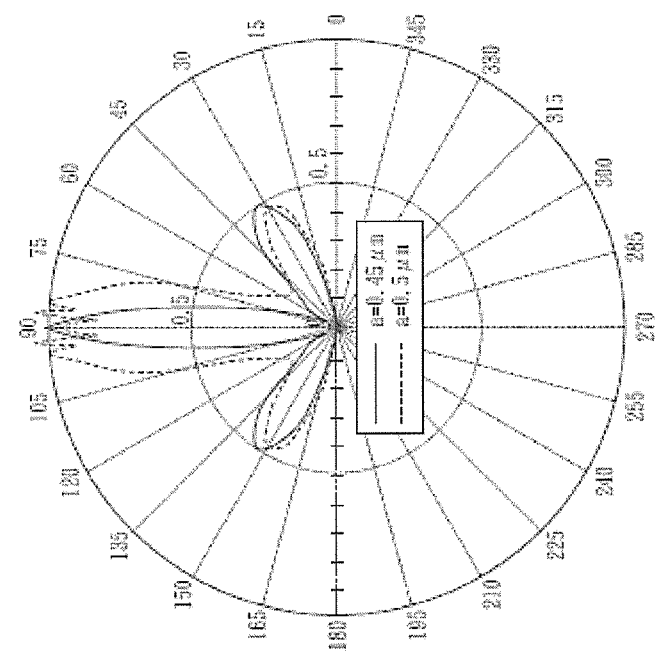
Figure 16F:
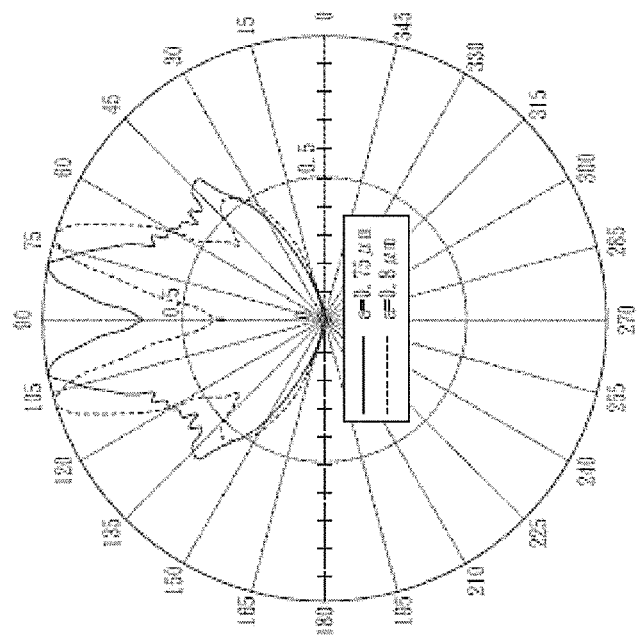
Figure 16E:
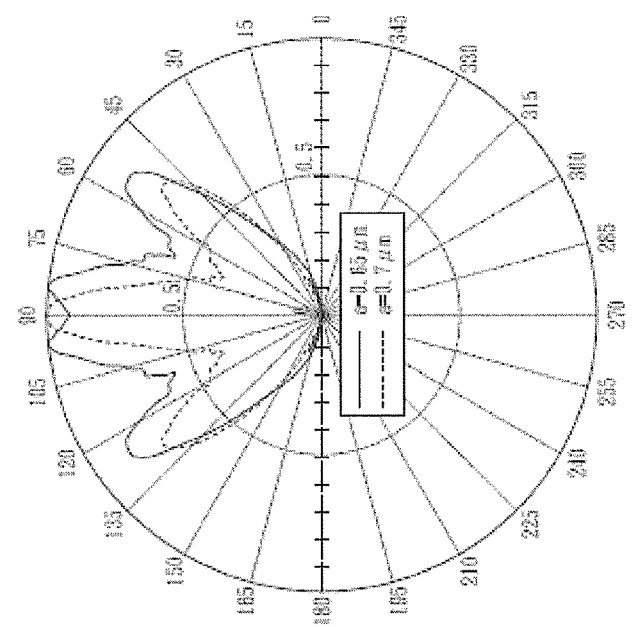

FIG. 15 shows the diffracted angle distributions of guided modes (circles) as a function of normalized frequency ($a/\lambda$). The circles shown in FIG. 15 refer to different guided modes in a semiconductor waveguide structure shown in FIG. 14. For simplicity, FIG. 15 only shows TE polarized guided modes. The number of guided modes depends on the thickness of the semiconductor structure. The thickness of the semiconductor structure corresponding to FIG. 15 is three micrometers, and the number of TE polarized guided modes is 25. The guided modes are distributed within a range depending on the diffracted angle of the photonic crystal, wherein the range is analogous to the divergence angle of far field light formation. As shown in FIG. 15, when $a/\lambda$ is 0.25, the diffracted angle is distributed within ±20 degrees, and therefore corresponds to the best collimation behavior. FIG. 16 shows far field patterns simulated by FDTD as function of normalized frequency ($a/\lambda$), wherein t=0.1 um and r/a=0.25. As shown in FIG. 16, when $a/\lambda$ is 0.25, the far field pattern corresponds to the best collimation behavior, which is consistent with the Bragg diffraction theory analysis.

Based on the effect of the period of a photonic crystal on light extraction efficiency and collimation behavior, the period of a photonic crystal for optimal collimation behavior are from 200 to 270 nanometers, while the period of a photonic crystal for optimal light extraction efficiency is 470 nanometers, which equals the wavelength of the emitted light. Since there is no overlap between these two criteria, a tradeoff must be made. The comments above are particular for the semiconductor waveguide structure shown in FIG. 13. As mentioned earlier, the parameters of a photonic crystal structure depend on the waveguide behavior of the semiconductor structure. For example, the proper period of a thin-GaN LED for optimal collimation behavior is 290 nanometers, which is different from the range of 200 to 270 nanometers given above.

Figure 17A:
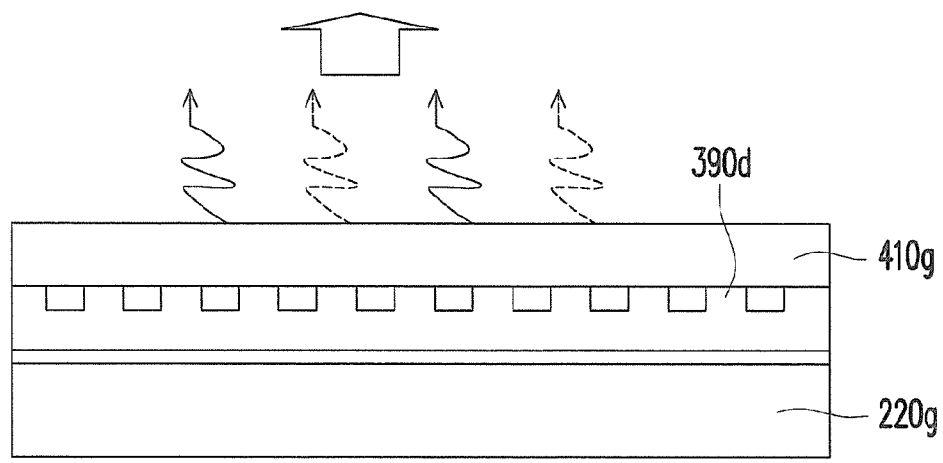
FIGS. 17A and 17B shows the implementation of white light source by combining photonic crystal structure and nanofluorescent powders.
Figure 17B:
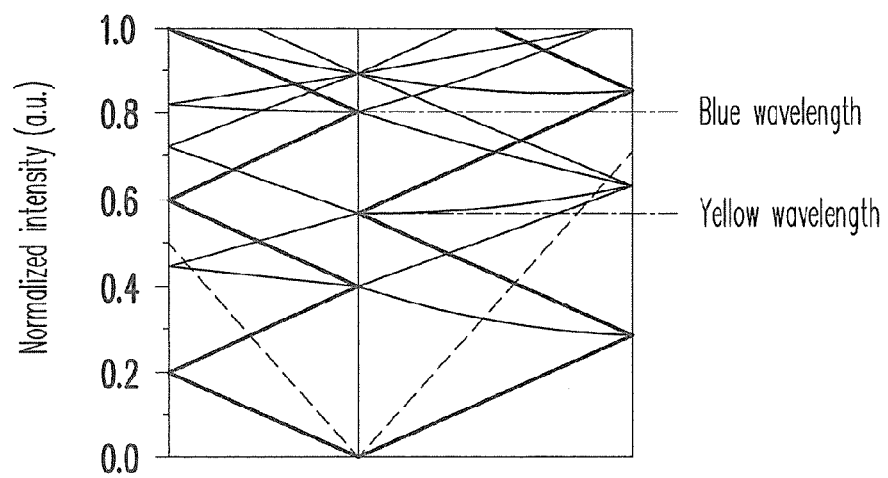

As to the collimation of an RGB LED display source, it is similar to the collimation of a white color LED display source. That is, nanofluorescent powders (e.g. nano-phosphors, quantum dots) are used to prevent light from scattering. The thickness of the fluorescent powder coating is thinner than the wavelength of the emitted light. The emission direction of the light excited by the fluorescent powders is controlled by the LED semiconductor waveguide structure and the photonic crystal structure. FIG. 17 shows the implementation of white light source by combining photonic crystal structure and nanofluorescent powders. As shown in FIG. 17A, most of the energy of the MQW emission and the light excited by the fluorescent powders 410g is distributed in the guided modes of the LED semiconductor waveguide structure 220g, and these two lights with different wavelengths then enter the air at the same direction via diffraction by the diffraction structure of the photonic crystal 390d. Accordingly, these two lights with different wavelengths are collimated to exhibit the same light formation, and then are mixed to display the white light formation. The photonic crystal structure 390d should be designed properly to achieve the above property. The corresponding dispersion relation among these two lights is shown in FIG. 17B.

Figure 18:
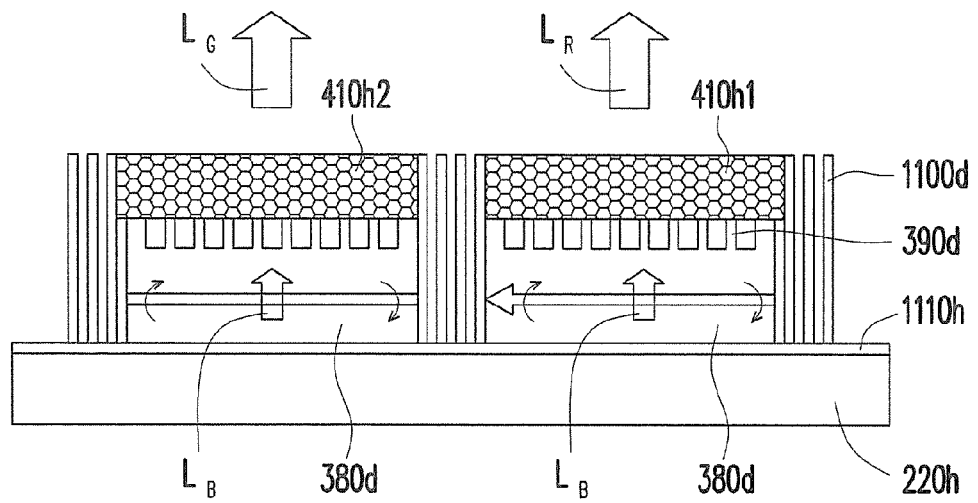
FIG. 18 shows an embodiment of photonic crystal structure which converts the light color by wavelength converting material.

FIG. 18 shows an embodiment of photonic crystal structure which converts the light color by wavelength converting material. Referring to FIG. 18, the LED structures 380d emit blue light $L_B$ or ultraviolet light. The wavelength converting material 410h1 is, for example, red phosphor, so as to convert blue light $L_B$ into red light $L_R$. Moreover, the wavelength converting material 410h2 is, for example, green phosphor, so as to convert the blue light $L_B$ into green light $L_G$.

Figure 19:
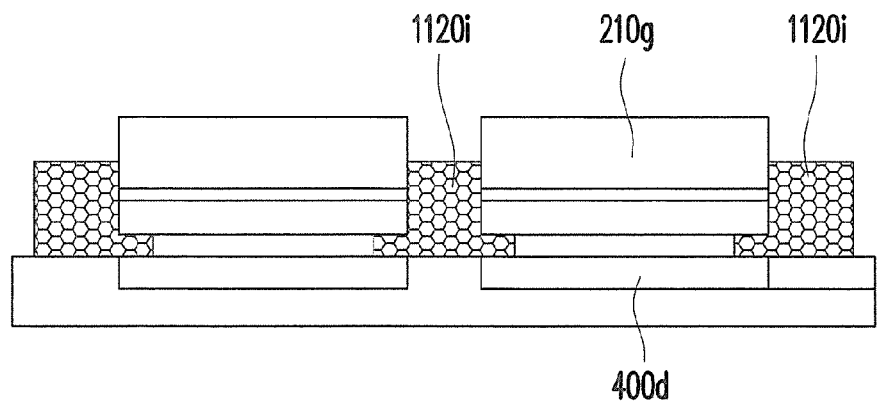
FIG. 19 shows an LED array according to another embodiment.

Since the current density is high when projecting images by the display source for image projection, a heat dissipation module is required to prevent the accumulated heat from damaging the LED and the connected switch circuit. The size of the heat dissipation module is also a factor. Since micro projection application has strict size requirement, a heat dissipation module with excessive size is not allowed. Accordingly, heat dissipation should be taken into consideration early in the design stages of the full-color display source. For example, it is advisable to bond the LED array 210g and the addressable circuit array 400d by high heat conducting material 1120i, for example electrically insulating and high heat conducting material, as shown in FIG. 19. In addition, instead of cooling fins which require space, it is advisable to use heat conducting material 1120i as the light electric blocking material between the LEDs to help dissipate heat into the air in the vertical and horizontal directions.

Figure 20:
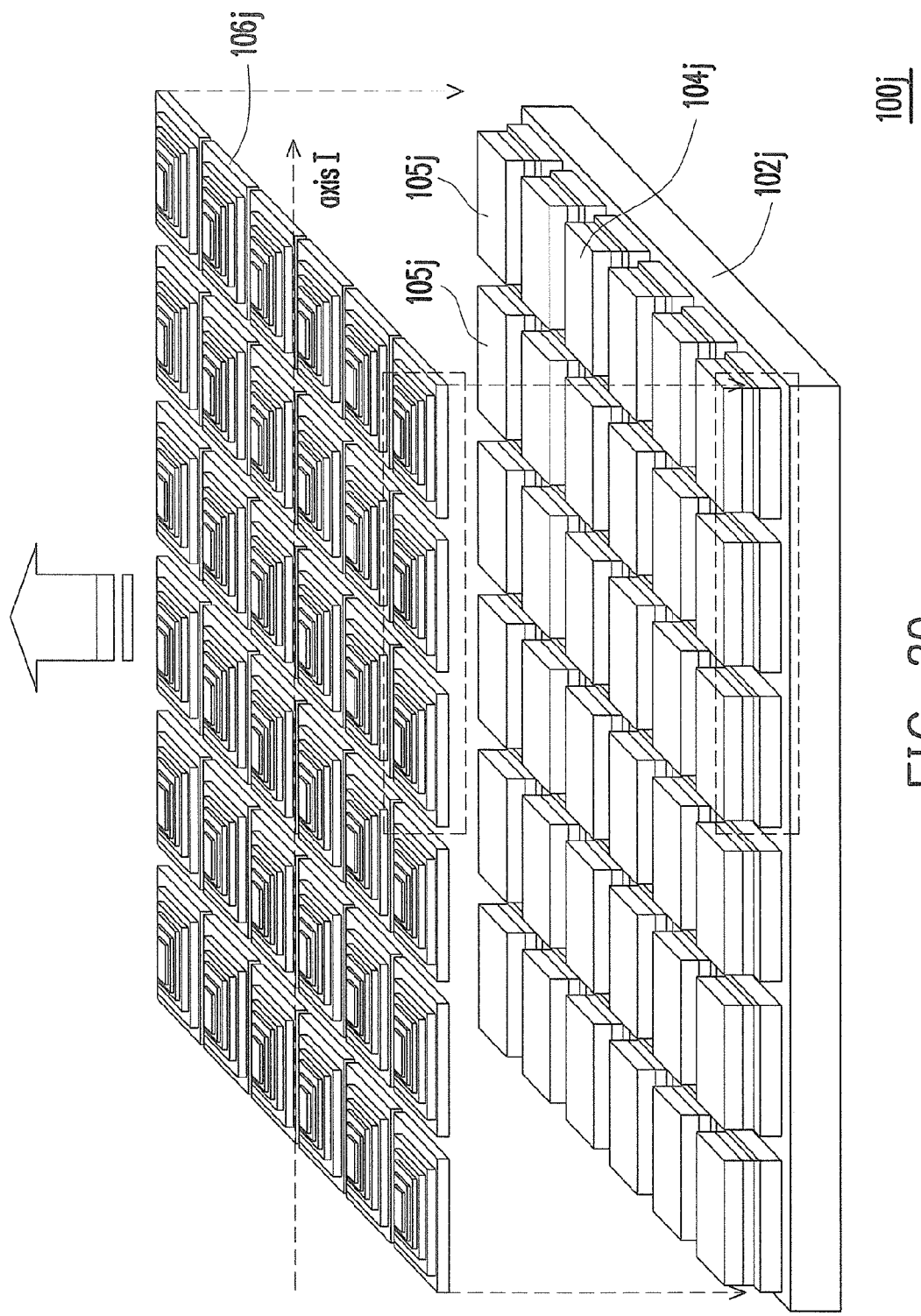
FIG. 20 shows the architecture of a projection display chip according to an exemplary embodiment.

FIG. 20 shows the architecture of a projection display chip according to an exemplary embodiment. The projection display chip 100j comprises a driving circuit device 102j, a micro-LED array 104j and a micro light controlling structure 106j. As shown in FIG. 20, the projection display chip 100j integrates a plurality of micro-LEDs 105j into an array in a single chip 100j, wherein the plurality of micro-LEDs 105j comprises red, blue and green LEDs, so as to display images in full color, wherein a pixel of red, blue and green emitter comprises a red LED, a blue LED and a green LED. The driving circuit device 102j drives the micro-LED array 104j. The projection display chip 100j also comprises an embedded active addressing control circuit 102j to control the micro-LEDs 105j individually to display images. The micro light controlling structure 106j is formed on or is attached to each micro-LED 105j for focusing and projecting to produce a directional light output. The micro light controlling structure 106j comprises a collimation device, a micro lens and an active adjustable lens.

In some embodiments, the micro-LED array 104j can be replaced by a micro laser diode array. In other embodiments, the micro-LED array 104j is implemented by organic LEDs. In some embodiments, the driving circuit device 102j is implemented by thin-film transistors, MOS transistors, or gallium nitride (GaN) transistors. In some embodiments, the micro-LED array 104 is adjustable by electronic signals.

Figure 21:
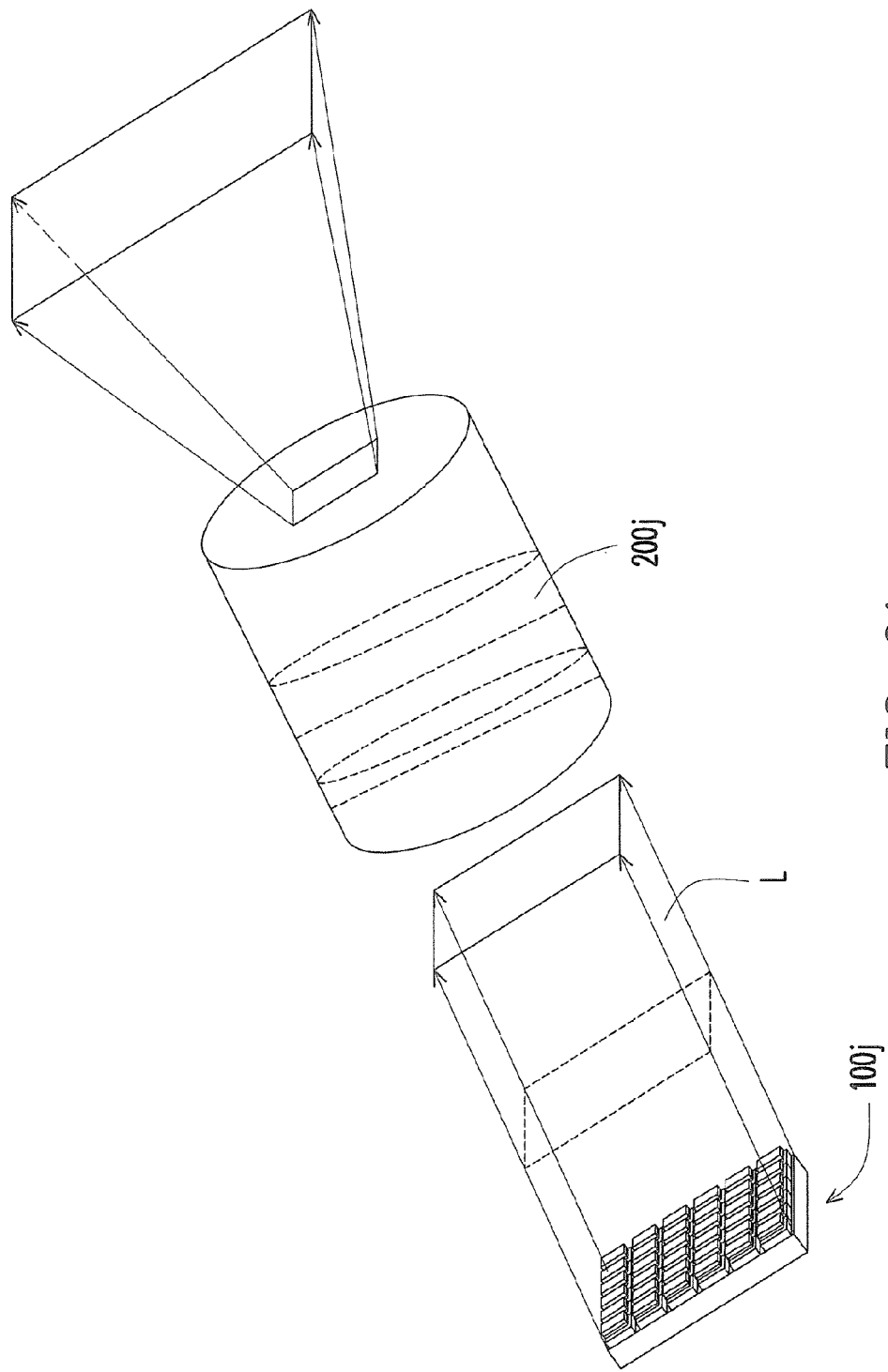
FIG. 21 shows the architecture of a projection display chip according to another exemplary embodiment.
Figure 22:
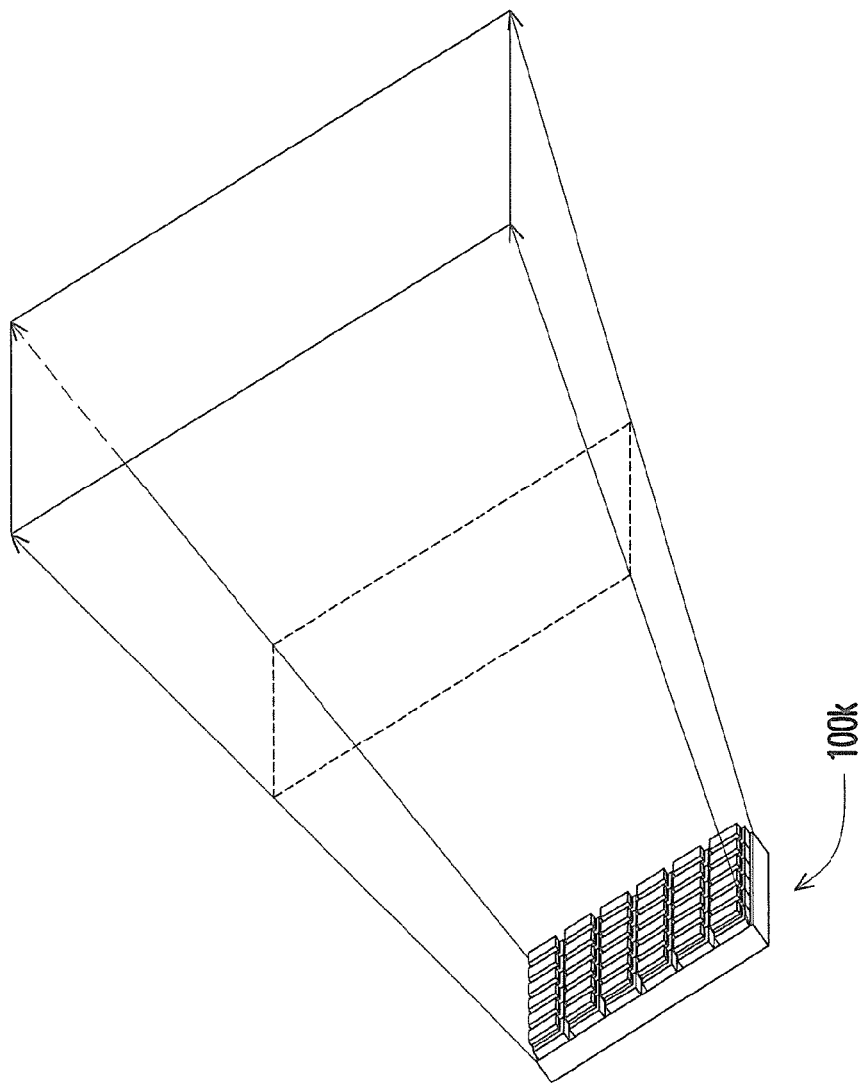
FIG. 22 shows the architecture of a projection display chip according to another exemplary embodiment.

The projection display chip 100j can be combined with a projection lens 200j to display a focused projection as shown in FIG. 21, or without a projection lens to display a focus-free projection using a projection display chip 100k as shown in FIG. 22. For different applications, the micro optical structure of the projection display chip 100j, 100k can be adjusted accordingly.

The micro light controlling structure 106j is an important feature in this disclosure. The micro light controlling structure 106j is required to efficiently focus the light emitted from each micro-LED and to prevent crosstalk among different micro-LEDs 105j from affecting the image quality.

In this disclosure, crosstalk refers to the spatial interference of the light emitted from the pixels. The size of each pixel in the micro array is extremely small (about 5 micrometers). Due to the small size and the highly concentrated arrangement of these pixels, crosstalk between different pixels must be carefully avoided. As long as the degree of collimation of light form of each pixel is high enough, for example as in limiting the angle of the light outputted from the micro-LEDs 105j to within a certain degree (e.g. <±11°, <±8° or <±2°, depending on the image quality and the micro light controlling structure 106j), the crosstalk problem can be overcome.

Therefore, the micro light controlling structure 106j according to the embodiments of this disclosure further comprises micro collimation devices, such as a micro lens array, micro apertures with surface plasmonic effect, a micro ring type structure, or a photonic crystal array. These micro collimation devices collimate the light emitted from the micro-LEDs toward one direction such that the angle of the light emitted from the micro-LEDs is limited to within certain degrees (such as <±11°<±8° or <±2°). The manufacture of these micro collimation devices 106j comprises attaching these micro collimation devices to the surface of the micro-LEDs or etching the surface of the micro-LEDs such that the light is collimated by the micro-LEDs 105j.

Figure 23:
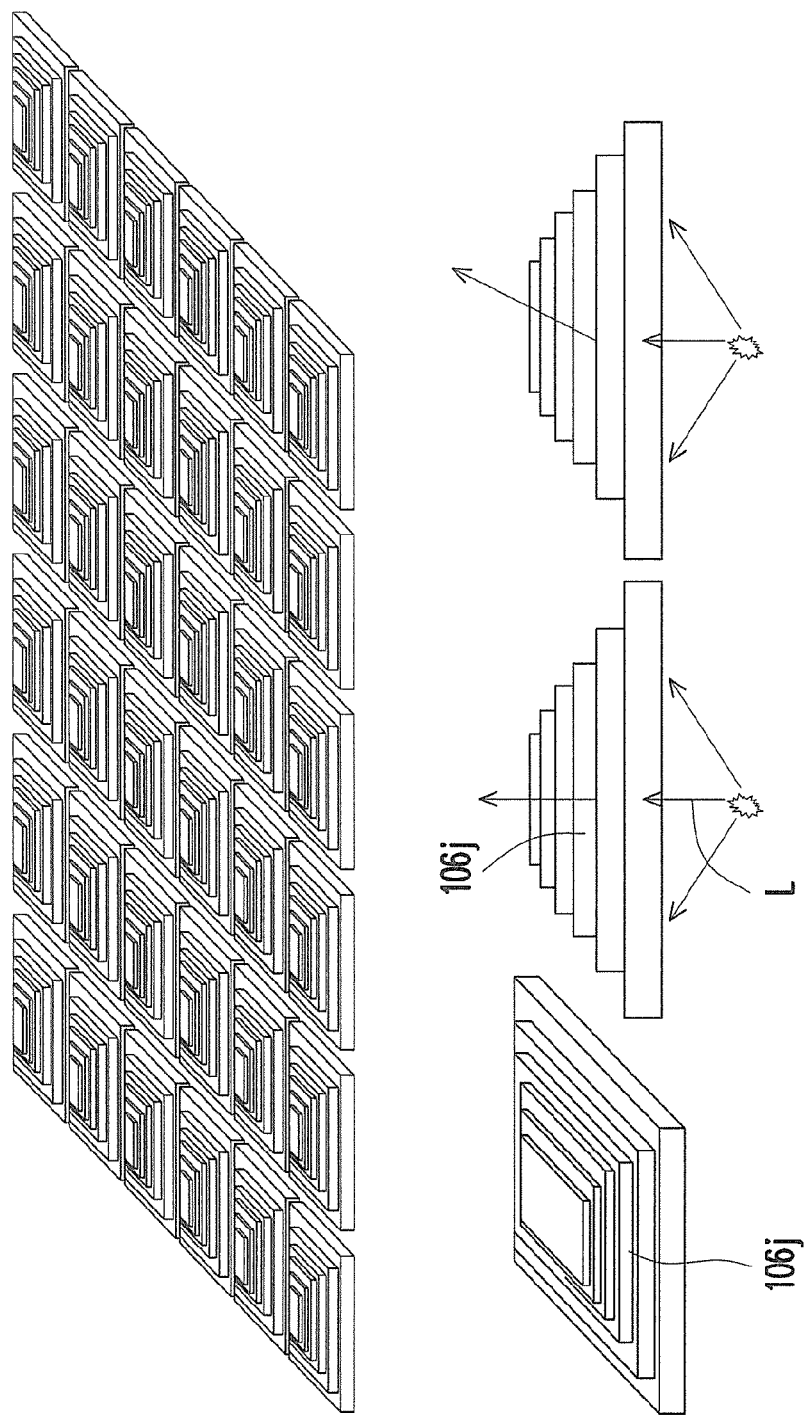
FIG. 23 shows the architecture of a micro lens array according to one exemplary embodiment.

FIG. 23 shows the architecture of a micro lens array according to one exemplary embodiment. As shown in FIG. 23, which shows the cross-section of one micro lens 106j, transparent dielectrics are stacked to form the micro projection lens array, and the stacking pattern of each micro light source is adjusted to form a desired light direction of light L.

Figure 24:
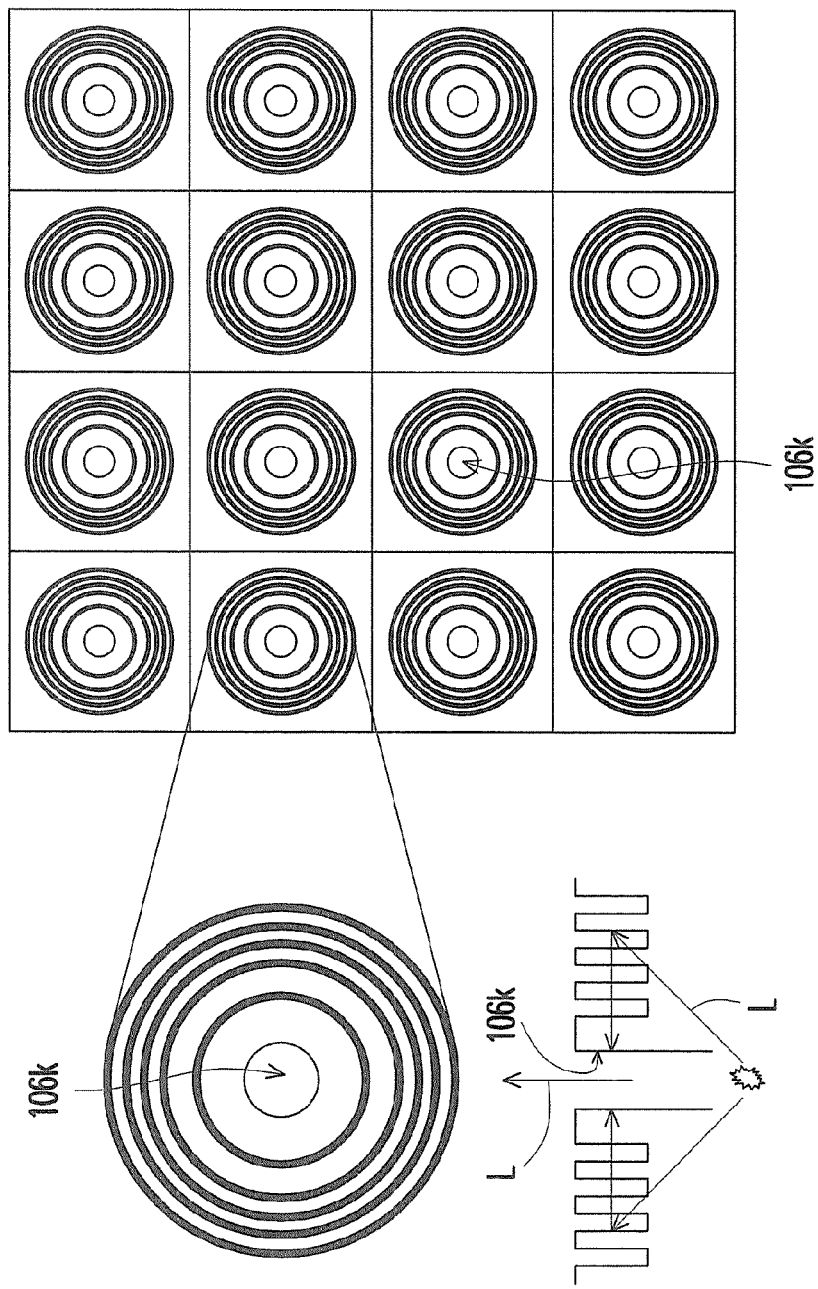
FIG. 24 shows the architecture of micro apertures with surface plasmonic effect according to one exemplary embodiment.

FIG. 24 shows the architecture of micro apertures with surface plasmonic effect according to one exemplary embodiment. As shown in FIG. 24, which shows the top view of the micro apertures with surface plasmonic effect, the top view of a micro aperture 106k and the side view of a micro aperture 106k, the light field of the micro apertures 106k with surface plasmonic effect exhibits high directivity.

Figure 25:
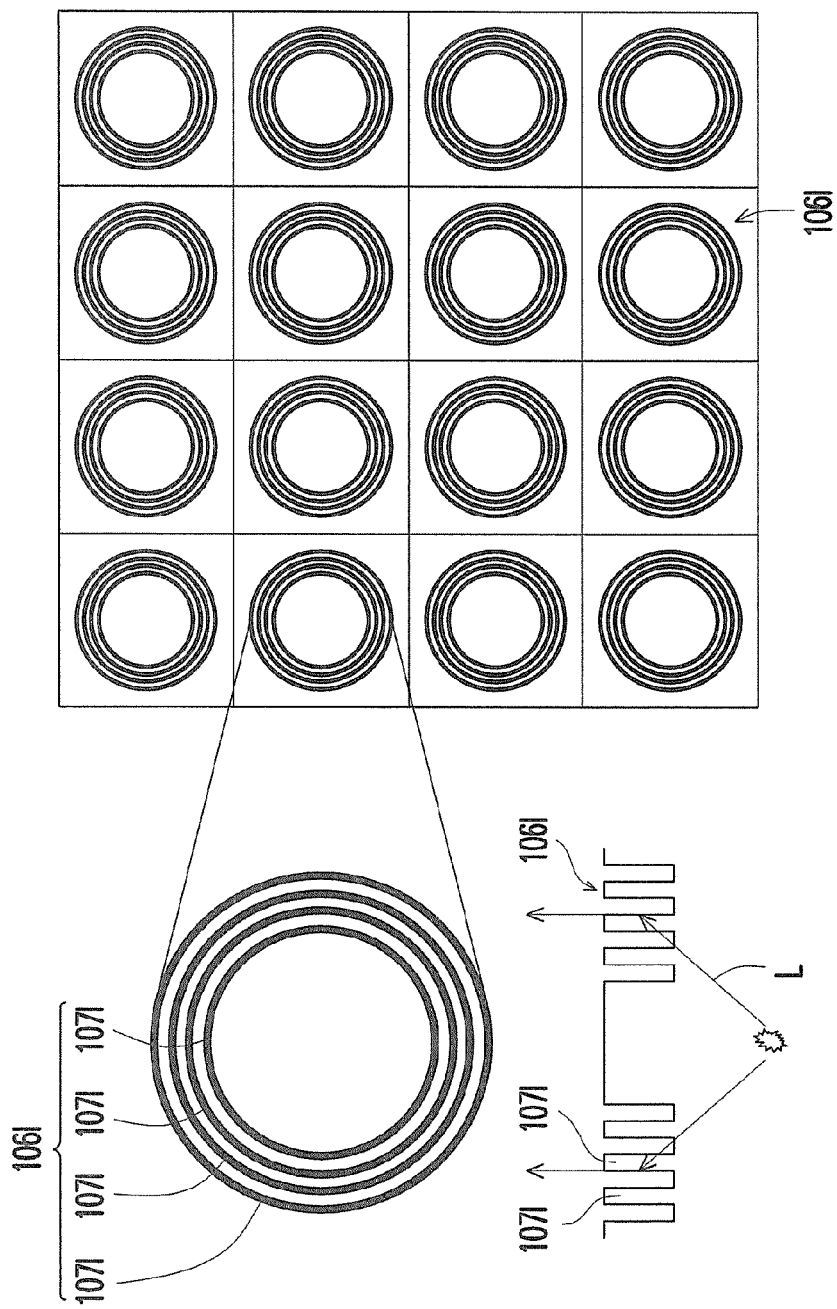
FIG. 25 shows the architecture of a micro ring type structure according to one exemplary embodiment.

FIG. 25 shows the architecture of a micro ring type structure according to one exemplary embodiment. As shown in FIG. 25, which shows the top view of the micro ring type structure 106l, the top view of a micro ring set 106l having a plurality of micro rings 107l and the side view of a micro ring set 106l having a plurality of micro rings 107l, the micro-ring type collimation lens array is formed by forming a micro-ring diffraction unit on each micro-LED to collimate the light L emitted from the micro-LED.

Figure 26:
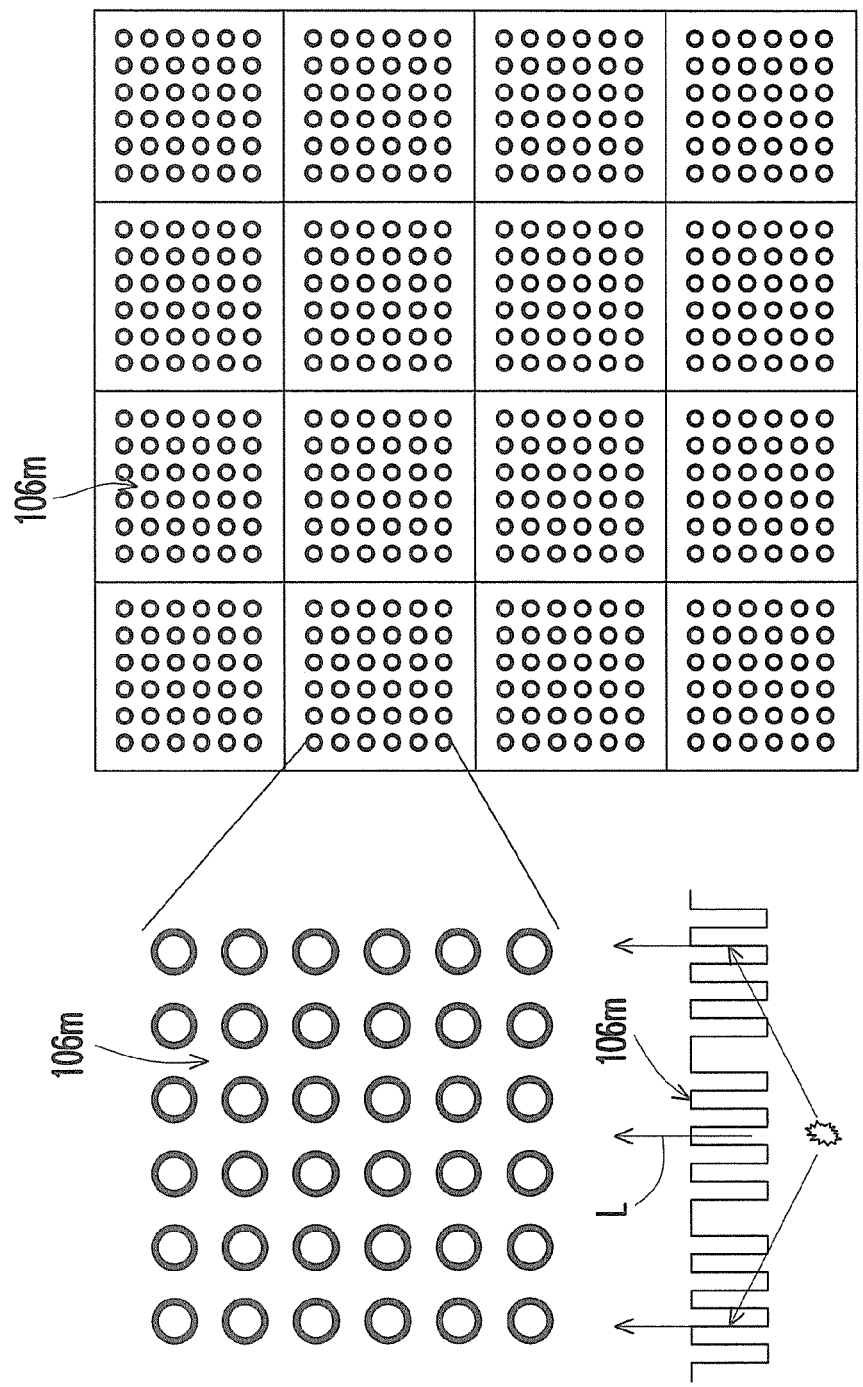
FIG. 26 shows the architecture of a photonic crystal array structure according to one exemplary embodiment.

FIG. 26 shows the architecture of a photonic crystal array according to one exemplary embodiment. As shown in FIG. 26, which shows the top view of the photonic crystal array 106m, the top view of a portion of the photonic crystal array 106m and the side view of the photonic crystal array 106m, the photonic crystal array 106m collimates the light L emitted from each micro-LED individually.

Figure 27:
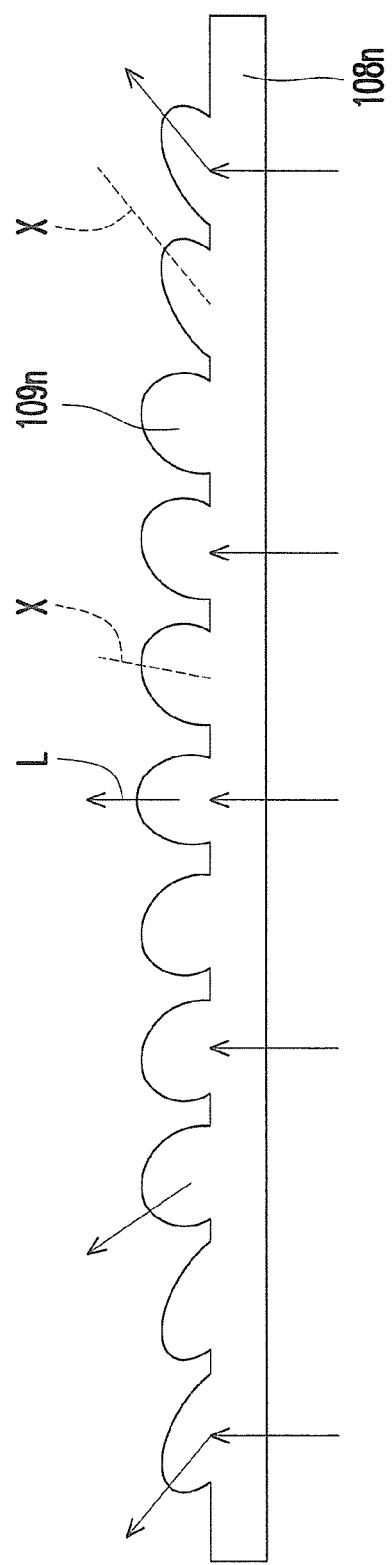
FIG. 27 shows a part of a micro light controlling structure according to one exemplary embodiment.

FIG. 27 shows a part of the micro light controlling structure 106 according to the one exemplary embodiment. As shown in FIG. 27, which shows the side view of the micro light controlling structure 106 shown in FIG. 1 along the axis I, the poly-axial micro projection lens array 108n focuses the light emitted from each pixel and alters the projection direction X by adjusting the geometrical structure of the lens 109n. Poly-axial optic lens film is the key for focus-free projection. The poly-axial optic lens film 108n is either formed directly on the aforementioned collimation devices by semiconductor manufacture process, or is formed in advance and then attached to the aforementioned collimation devices. Accordingly, lights L are focused in different directions, and images can be displayed on any surface without enlargement by focusing the lens. The projection degree increases with the distance between each micro lens unit and the projection axis. The projection degree also depends on the projection distance and the throw ratio (projection distance/width of the image).

Figure 28:
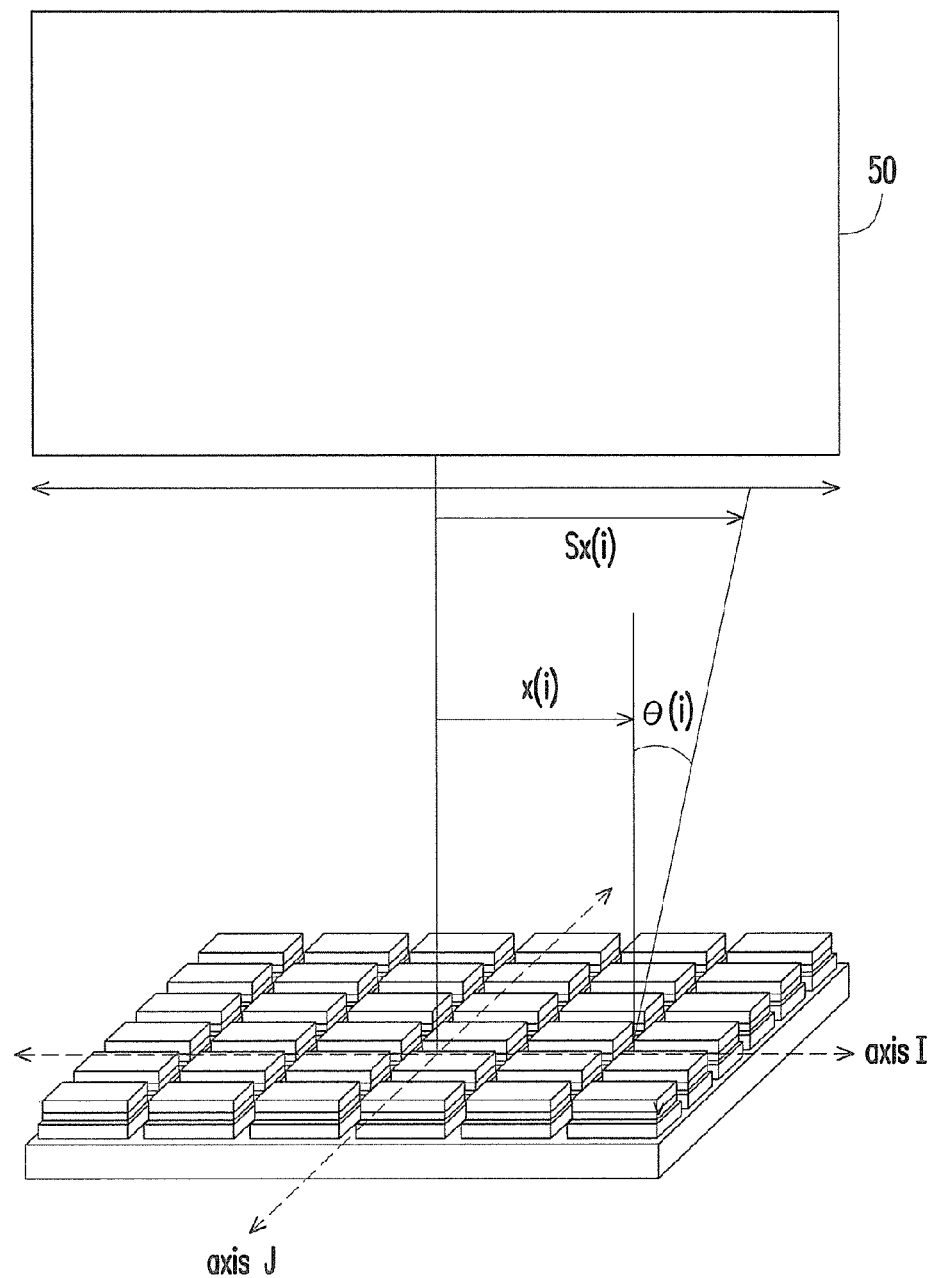
FIG. 28 shows the arrangement relation of the axis of the lens unit of the poly-axial micro projection lens array according to one exemplary embodiment.

FIG. 28 shows the arrangement relation of the axis of the lens unit of the poly-axial micro projection lens array according to one exemplary embodiment. As shown in FIG. 28, the arrangement relation of the axis of the lens unit of the poly-axial micro projection lens array (only the axis I is marked) is shown. The size of the projection chip, i.e. the size of the poly-axial micro projection lens array, is X×Y. The resolution is represented as (Rx, Ry). The size of the projection image depends on the throw ratio (which is equal to D/(2Sx), wherein D represents the projection distance and 2Sx represents the image width). If the throw ratio is small, an image of a specific size can be displayed within a short distance. The poly-axial micro projection lens array is a two-dimensional array, wherein the angle of the projection axis (θ,ϕ) and the location (i, j) of each lens unit are mutually dependent, and θ and i represent the angle and location pointer on the axis I, and ϕ and j represent the angle and location pointer on the axis J.

In the embodiments of this disclosure, the calculation of θ is as follows:

$$\theta(i) = \tan^{-1}\left(\frac{s_x(i) - x(i)}{D}\right)$$

$$s_x(i) = \frac{2S_x}{R_x}i$$

$$x(i) = \frac{X}{R_x}i, \; i = -R_x/2 \text{ to } R_x/2, \; i \in \text{Int.}$$

The calculation of ϕ is as follows:

$$\varphi(j) = \tan^{-1}\left(\frac{s_y(j) - y(j)}{D}\right)$$

-continued $$s_y(j) = \frac{2S_y}{R_y} j$$

$$y(j) = \frac{Y}{R_y} j, \ j = -R_y/2 \text{ to } R_y/2, \ j \in \text{Int.}$$

Accordingly, the directions of the axes of each lens unit of the poly-axial micro projection lens array can be defined based on the above equations.

During manufacture, the defined poly-axial micro projection lens array can be formed on the micro-LED array by semiconductor manufacture process. As shown in FIG. 23, multiple layer exposure mask technique is used to define the size of lens on each layer. Filming and etching techniques are also used to form layers of lenses with different axis directions.

In addition to the poly-axial micro projection lens array, the embodiments of this disclosure also provide a nanoscale structure formed on the micro LEDs, such as the photonic crystal array shown in FIG. 26, to maintain the vertical axes of these LEDs for images to be effectively projected and displayed on a screen. The photonic crystal is a nanoscale structure with periodically formed apertures, and such structure can be manufactured in the micro-LEDs by semiconductor manufacture process.

Compared with the two-dimensional periodic aperture structure of the photonic crystal, the micro-ring type grating shown in FIG. 25 exhibits a one-dimensional periodic grating structure. The micro-ring type grating can be formed by etching the surface of the micro-LEDs to form a plurality of concentric recess regions by semiconductor manufacture process. The principles of the micro-ring type grating and the photonic crystal are the same. Therefore, the micro-ring type grating can also be designed according to diffraction theory.

FIG. 24 shows a grating structure formed by a nanoscale aperture structure 106k surrounded by a metal film. Due to the surface plasmonic effect and aperture effect between the metal grating structure and the semiconductor material, a constructive interference perpendicular to the surface of the micro-LEDs is established, and a destructive interference away from the direction perpendicular to the surface of the micro-LEDs is also established. Therefore, a light field with an extremely high degree of collimation is obtained.

In conclusion, this disclosure provides a projection display chip, which can integrate light sources of traditional projector, display devices (such as DLP, LCoS and LCD), and optic lenses into a single chip without external light sources or projection lenses. Therefore, the projection display chip of this disclosure exhibits small size and high efficiency such that it can be easily integrated in a mobile device.

Figure 29:
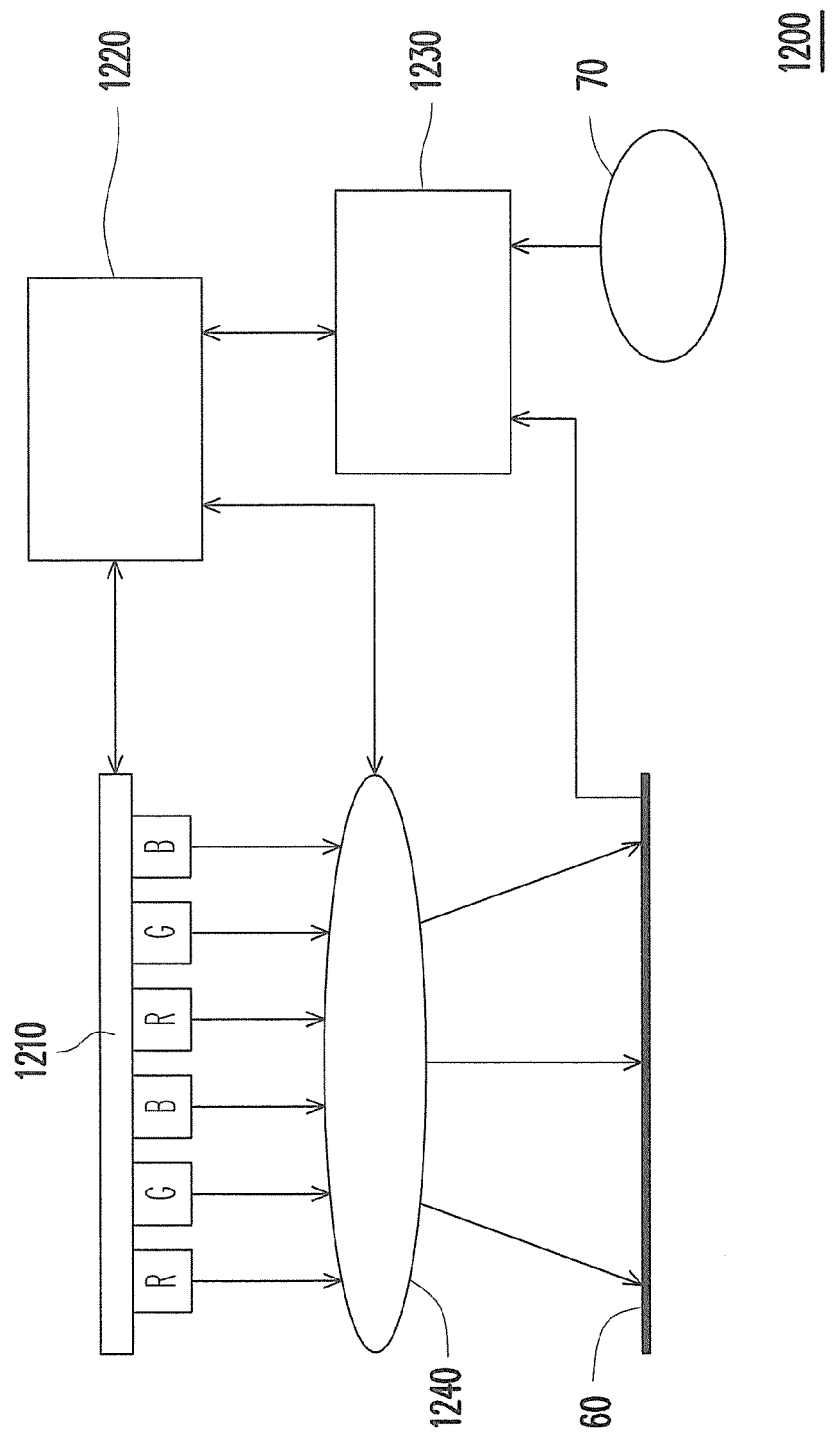
FIG. 29 is a schematic drawing showing the feedback control system of the smart micro-projection device according to the fourth embodiment of the present disclosure.

FIG. 29 is a schematic drawing showing the feedback control system of the smart micro-projection device according to the fourth embodiment of the present disclosure. Referring to FIG. 29, the smart micro-projection device includes a micro-LED array 1210, a projection module 1240 (e.g. a projection optics), a sensor 1230 (e.g. an optical sensor) and a control unit (e.g. a projector control electronics) 1220. The projector control electronics 1220 has a feedback mechanism according to the surrounding luminous, the status of the projection optics 1240 and the related relationship between the projection optics 1240 and the screen 60 detected by the sensor 1230. In this embodiment, the sensor 1230 (e.g. an optical sensor) is for detecting at least one of brightness of the environment, brightness of a frame formed by the image beam projected onto the screen 60, and a shape of the frame so as to generate a signal to the control unit (e.g. the projector control electronics 1220). The projector control electronics 1220 controls dynamically the output luminous flux from the micro-LED array 1210 to keep the brightness of images projected to the screen 60 constant and sufficient, by sensor 1230 feedback according to projection distance and surrounding luminous 70. The contrast of the projected image on the screen 60 is sensed, so that the projection optics 1240 is adjusted by the projector control electronics 1220 to focus the image, and thus the image contrast can be improved. The geometrical distortion of the projected image is calibrated and the hand shaking is reduced by the feedback control system as well.

Moreover, in general, the micro-projection device 1200 is used any where any time. When the optical axis of projection optics 1240 is not perpendicular to the screen 60, the projected image is usually has trapezoid distortion accordingly. In order to keep the normal projected image, it is necessary to adjust the disposing angle of the projection optics constantly. Furthermore, since micro-projection device 1200 is usually for handheld use, when users use the micro-projection device with hand, the projected image is easily shaking and affects the display quality. In order to solve the foregoing problems, a micro-projection device 1200 is accomplished by utilizing a dynamic sensor 1230 to detect a relative position, a relative angle and a relative motion between the projector and the screen, and feedback the detected information to the micro-LED array to corresponding calibrate the geometrical distortion and eliminate the shaking.

Figure 30A:
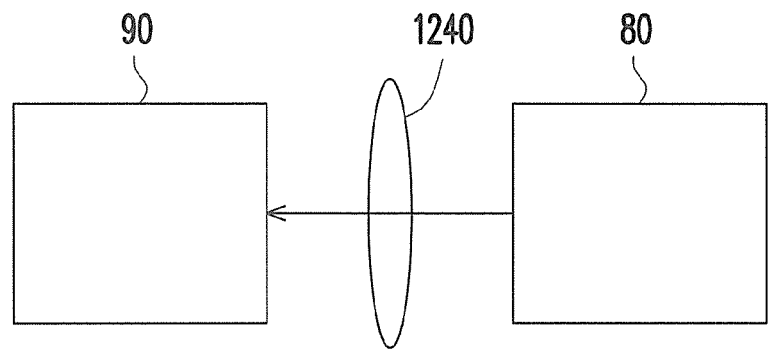
FIGS. 30A-30C shows the operation of the feedback control system of FIG. 29.
Figure 30B:
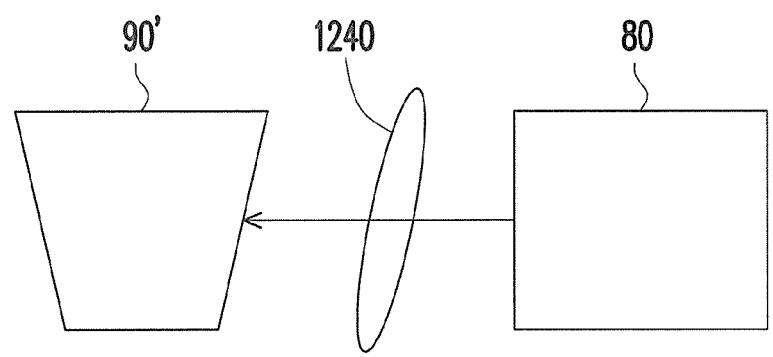
Figure 30C:
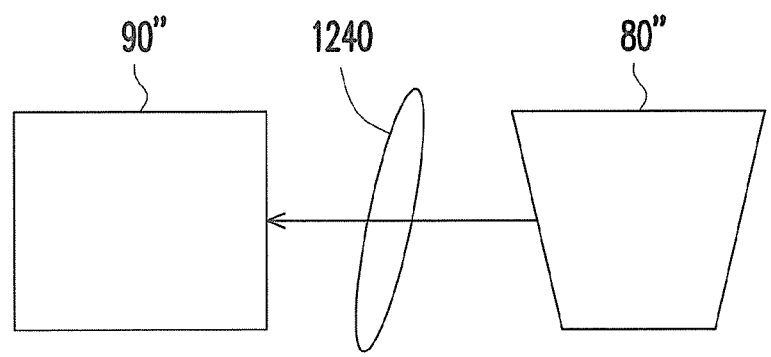

For example, FIGS. 30A through 30C are schematic drawings showing the disposing relationships between the projection device and the screen. Referring to FIG. 30A, when the projecting direction of the projection device 1200 is vertical to the screen 60, the projected image 90, due to the original image 80 on the micro-LED array 1210, on the screen can be normally display without distortion. Referring to FIG. 30B, when a angle between the projecting direction of the projection device 1200 and the screen 60 is not equal to 90 degrees, the projected image 90' from the conventional projection device 1200 shows a trapezoid distortion. Referring to FIG. 30C, the projection device 1200 in this embodiment can calibrate and compensate the image formation device of micro-LED array 1210 through the projector control unit 1220 by detecting the space relation between the projection device 1200 and the screen 60 using the sensor 1230, so that the projected image 90" can be normally display without distortion in any angle between the projecting direction of the projection device 1200 and the screen since the image 80" on the micro-LED array 1210 is adjusted.

In addition, the projection distance of the projection device varies largely from the location of screen, such as wall, ceiling, tabletop, etc. or any surface). When the projection distance is too small, the brightness of the projected image is over-bright under a condition that the projection device output a constant luminance, and users need to adjust the brightness manually to improve the over-bright phenomenon. On the other hand, when the projection distance is too far, the brightness of the projected image is over-dark under a condition that the projection device output a constant luminance, and users need to adjust the brightness manually to improve the over-dark phenomenon.

To solve the foregoing problems, a built-in sensor 1230 is disposed within the micro-projection device 1200, so that the micro-projection device 1200 can adjust the brightness of the projected image according to the detection of sensor 1230. More specifically, the sensor 1230 obtains information of environmental brightness 70, projection distance or the brightness of the projected image, and then feedbacks to the projection control unit 1220, so as control the projection optics 1240 and the active light emitting display 1210, i.e. micro-LED array, to adjust the output luminous flux and the focus distance. Accordingly, a suitable brightness and contrast of the projected image can be shown under a specific environmental brightness, so as to avoid unnecessary energy loss due to over-bright.

Moreover, the sensor 1230 may be infrared receiver/transmitter, charge coupled device (CCD), complementary metal-oxide semiconductor (CMOS), photon detector, and even though a microwave receiver/transmitter etc., any device having functions of light-sensing, distance-measuring and/or image-analyzing. The projector control unit 1220 is a processor and deals with feedback electrical signals or feedback optical signals sent by the sensor 1230. The projector control unit 1220 determines the suitable brightness of the active light emitting display or the suitable position of the projection optics according to operation of the feedback signal, so as to adjust display optical characteristics of an image, such as the contrast, the sharpness, color rendering index, color temperature, geometrical distortion, distortion and brightness, etc. The active light emitting display includes a micro-LED array 1210 with a circuit array, which can independently control the switch of each micro-LED. The switch circuit is controlled through the driving IC, so as to enable micro-LED array to form an image.

Furthermore, an optical collimation, such as a light condensing structure like micro-lens, photonic crystal structure or light grating unit, etc., can be further combined in the active light emitting, so that the diverging angle of the field of illumination of the LED can be converged. The diverging angle field of illumination after converged may reduce the stray light, and reduce the size of the projection optics. Consequently, it would be beneficial to the micro-projection device system.

Table 1 shows a luminance range of normal environment.

TABLE 1 typical environment luminance (unit: lux = lm/m²)

| dark night | 0.001~0.02 |
| moonlit night | 0.02~0.3 |
| meeting room (close the window curtains) | ≤1 |
| in the office (illuminate by fluorescent lamps) | 50~100 |
| a window seat indoors (cloudy day) | 5~50 |
| a window seat indoors (sunny day) | 100~1000 |
| sunlight at noonday in summer | 109 |
| Required luminance for reading book | 50~60 |

Table 2 shows the luminance of the projected image corresponding to different size of projection screen using a projection device with 100 lm output. Referring to Table 2, take the screen size with 25 inches for example, since the luminance is 517 Lux which is far more greater than the almost environment luminance, the outputted luminance can be reduced by the feedback mechanism, so as to save power.

TABLE 2

| size of projection screen (inch) | Luminance (Lux) |
|---|---|
| 25 | 517 |
| 32 | 315 |
| 46 | 151 |
| 60 | 90 |

Besides, micro structures can be fabricated on the projection screen for choosing the wavelength or polarization. By reflecting the light having different wavelength or polarization to two eyes of viewer respectively, the viewer views a three-dimensional stereoscopic image, and thus the micro-projection device in this condition may applied to a stereoscopic projection field (e.g. 3D display). In this application, the display source is required to output two distinguish image according to wavelength or polarization.

In summary, one application of the present disclosure is utilizing a full color micro-LED array to replace the light source and the display device of the normal projection device, so that the system size can be efficiently reduced, the required elements can be reduced, the cost can be saved, and the light efficiency can be improved. By the feedback mechanism provided by the sensor and the projector control unit, the outputted luminance of the micro-LED array can be controlled according to the environment brightness and the projection distance, so that the brightness of projected image can be shown in a minimum total electricity consumption way, and thus satisfy the user requirement of the handheld micro projection device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An imaging apparatus adapted to form an image, the imaging apparatus comprising:
    a light-emitting unit array for emitting an image beam, the light-emitting unit array comprising a plurality of light-emitting units monolithically integrated;
    a circuit substrate disposed under the light-emitting unit array, wherein the circuit substrate is electrically connected to the light-emitting unit array for individual driving the light-emitting units;
    an optical sensor, for detecting electromagnetic waves from at least one of the image and an environment so as to generate a signal;
    a control unit, electrically coupled to the light-emitting unit array and the optical sensor for controlling emission of the light-emitting unit array according to the signal from the optical sensor; and
    an image-forming optics for propagating the image beam to form the image, wherein the image-forming optics is electrically coupled to the control unit, and the control unit controls the image-forming optics according to the signal from the optical sensor.

2. The imaging apparatus according to claim 1, wherein the optical sensor comprises at least one of an infrared receiver, an infrared transmitter, a charge coupled device, a complementary metal oxide semiconductor detector, a photon detector, a microwave receiver, and a microwave transmitter.

3. The imaging apparatus according to claim 1, wherein the optical sensor is for detecting at least one of brightness of the environment, brightness of a frame formed by the image beam, and a shape of the frame so as to generate the signal to the control unit.

4. The imaging apparatus according to claim 1, wherein the optical sensor is a dynamic sensor configured to detect at least one of a relative position, a relative angle, and a relative motion of the imaging apparatus with respect to the image so as to generate the signal to the control unit.

5. The imaging apparatus according to claim 1, wherein each of the light-emitting units comprises a first doped type layer, a second doped type layer, and a light emission layer disposed between the first doped type layer and the second doped type layer, the imaging apparatus further comprises a reflective layer disposed between the light-emitting units and the circuit substrate, and the first doped type layer is disposed between the light emission layer and the reflective layer.

6. The imaging apparatus according to claim 5, wherein at least one of the first and second doped type layers has a surface facing away from the light emission layer and having a photonic crystal structure on the at least one of the first and second doped type layers.

7. The imaging apparatus according to claim 6, wherein the photonic crystal structure comprises a plurality of micro-protrusions periodically or non-periodically arranged on the at least one of the first and second doped type layers.

8. The imaging apparatus according to claim 5, wherein a thickness between the reflective layer and a surface of the light-emitting units facing away from the reflective layer is T, so as to satisfy $T<n\lambda$ and $T=(\lambda/2n)*m +(\lambda/4n)+\psi$, wherein n is a refractive index of the light-emitting units, $\lambda$ is a wavelength of emission from the light emission layer, $\psi$ is an optical phase shift due to interfaces between the light-emitting units and air and between the light-emitting units and the reflective layer, and in is a positive integer.

9. The imaging apparatus according to claim 8, wherein at least one of the first and second doped type layers has a surface facing away from the light emission layer and having a photonic crystal structure on the at least one of the first and second doped type layers, wherein the photonic crystal structure comprises a plurality of micro-protrusions periodically or non-periodically arranged on the at least one of the first and second doped type layers.

10. The imaging apparatus according to claim 5, wherein the light-emitting unit array further comprises an electrode layer covering the light-emitting units and electrically connecting to each of the light-emitting units, wherein the electrode layer is transparent or has openings respectively corresponding to the light-emitting units.

11. The imaging apparatus according to claim 5, wherein the light-emitting unit array further comprises a plurality of wavelength converting structures respectively disposed on at least a part of the light-emitting units.

12. The imaging apparatus according to claim 5, wherein the light-emitting unit array further comprises a plurality of photonic crystal phosphor patterns respectively disposed on at least a part of the light-emitting units.

13. The imaging apparatus according to claim 5, wherein the light-emitting unit array further comprises a plurality of nano-particles patterns or nano-phosphors patterns respectively disposed on at least a part of the light-emitting units.

14. The imaging apparatus according to claim 5, wherein the light-emitting unit array further comprises a plurality of micro-lenses respectively disposed on the light-emitting units.

15. The imaging apparatus according to claim 14, wherein a partition material is formed between any two adjacent micro-lenses, and the partition material is a light-shielding material or a light-reflecting material.

16. The imaging apparatus according to claim 14, wherein at least one air gap is formed between any two adjacent micro-lenses.

17. The imaging apparatus according to claim 14, wherein the light-emitting unit array further comprises a plurality of wavelength converting structures disposed between the micro-lenses and the light-emitting units.

18. The imaging apparatus according to claim 14, wherein the light-emitting unit array further comprises a plurality of wavelength converting structures disposed on the micro-lenses.

19. The imaging apparatus according to claim 14, wherein the micro-lenses have different optical axes to enlarge the image, and extending directions of the optical axes gradually spread out from a middle of the micro-lenses to a side of the micro-lenses.

20. The imaging apparatus according to claim 5, wherein a bandgap photonic crystal structure is disposed between any two adjacent light-emitting units.

21. The imaging apparatus according to claim 1, wherein an electrically insulating and heat conducting material disposed between any two adjacent light-emitting units, and a part of the electrically insulating and heat conducting material is disposed between the light-emitting units and the circuit substrate.

22. The imaging apparatus according to claim 1, wherein the circuit substrate comprises a plurality of transistors respectively electrically connected to the light-emitting units.

23. The imaging apparatus according to claim 22, wherein the transistors are thin-film transistors, metal-oxide-semiconductor (MOS) transistors or gallium nitride (GaN) transistors.

24. The imaging apparatus according to claim 22, wherein the light-emitting unit array further comprises a plurality of conductive patterns respectively connecting the light-emitting units and the corresponding transistors.

25. The imaging apparatus according to claim 1, wherein the light-emitting units are laser diodes, light-emitting diodes (LEDs) or organic LEDs.

26. The imaging apparatus according to claim 1, further comprises a plurality of micro-ring sets respectively disposed on the light-emitting units.

27. The imaging apparatus according to claim 1, further comprises a plurality of surface plasmonic apertures respectively disposed on the light-emitting units.

28. The imaging apparatus according to claim 1, further comprises a plurality of transparent dielectric lenses respectively disposed on the light-emitting units.

29. The imaging apparatus according to claim 1, further comprises a plurality of micro adjustable lenses respectively disposed on the light-emitting units.

30. The imaging apparatus according to claim 29, wherein focus and optical axes of the micro adjustable lenses are adjusted by electronic signals.

31. The imaging apparatus according to claim 1, wherein the image-forming optics forms the image on a screen, and the optical sensor is configured to detect the electromagnetic waves from the screen so as to generate the signal.

32. The imaging apparatus according to claim 1, wherein the image-forming optics is a projection optics for projecting the image beam onto the screen.

33. The imaging apparatus according to claim 1, wherein the control unit determines a suitable brightness of the light-emitting unit array or a suitable position of the image-forming optics according to operation of the signal.

34. The imaging apparatus according to claim 1, wherein the control unit adjusts at least one of contrast, sharpness, color rendering index, color temperature, geometrical distortion, distortion and brightness of display optical characteristics of the image according to operation of the signal.

* * * * *